United States Patent
Hirose et al.

(10) Patent No.: US 10,845,119 B2
(45) Date of Patent: Nov. 24, 2020

(54) METHOD OF ARRANGING TREATMENT PROCESS

(71) Applicant: TOKYO ELECTRON LIMITED, Tokyo (JP)

(72) Inventors: Jun Hirose, Miyagi (JP); Norihiko Amikura, Miyagi (JP); Risako Miyoshi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 397 days.

(21) Appl. No.: 15/450,876

(22) Filed: Mar. 6, 2017

(65) Prior Publication Data

US 2017/0261258 A1 Sep. 14, 2017

(30) Foreign Application Priority Data

Mar. 10, 2016 (JP) .................. 2016-047051

(51) Int. Cl.
*F26B 7/00* (2006.01)
*F26B 3/04* (2006.01)
*H01J 37/32* (2006.01)

(52) U.S. Cl.
CPC ............ *F26B 3/04* (2013.01); *H01J 37/3244* (2013.01); *H01J 37/32449* (2013.01); *H01J 37/32192* (2013.01)

(58) Field of Classification Search
CPC ... F26B 3/04; H01J 37/3244; H01J 37/32449; H01J 37/32192
USPC ......... 34/380; 137/100, 101.19, 2, 594, 595, 137/861, 862
See application file for complete search history.

(56) References Cited

U.S. PATENT DOCUMENTS

| 4,773,225 A * | 9/1988 | Bachschmid | ........... F01D 17/04 60/602 |
| 2003/0003696 A1* | 1/2003 | Gelatos | ............... C23C 16/4405 438/485 |
| 2005/0097730 A1* | 5/2005 | Yamamoto | .......... H01J 37/3244 29/745 |
| 2008/0078746 A1* | 4/2008 | Masuda | .............. H01J 37/3244 216/79 |
| 2010/0267243 A1* | 10/2010 | Kawakami | ........ H01J 37/32091 438/710 |

FOREIGN PATENT DOCUMENTS

JP H09-283504 A 10/1997

* cited by examiner

*Primary Examiner* — John P McCormack
(74) *Attorney, Agent, or Firm* — Studebaker & Brackett PC

(57) ABSTRACT

A method includes a step of increasing or decreasing a flow rate of a gas of the a second gas supply system, by a predetermined time from a start of a gas treatment step of the process recipe or a by a predetermined time before a start of the gas treatment step, by using apparatus information regarding a first gas supply system of the first substrate treatment apparatus and the second gas supply system of the second substrate treatment apparatus, and arranging the treatment process, and in this step, the treatment process of the second substrate treatment apparatus performed using the process recipe conforms to the treatment process of the first substrate treatment apparatus performed using the process recipe.

20 Claims, 6 Drawing Sheets

METHOD OF ARRANGING TREATMENT PROCESS

CROSS-REFERENCE TO RELATED APPLICATION

This application is based on and claims priority from Japanese Patent Application No. 2016-047051 filed on Mar. 10, 2016, with the Japan Patent Office, the disclosures of which are incorporated herein in their entireties by reference.

TECHNICAL FIELD

Exemplary embodiments of the present disclosure relates to a method for arranging a treatment process.

BACKGROUND

In a substrate treatment apparatus such as a plasma treatment apparatus, gas is supplied from a gas supply system to a treatment vessel of this substrate treatment apparatus and a substrate is treated. In the substrate treatment apparatus, a plurality of kinds of treatments may be performed in order. Accordingly, the gas supply system may have a configuration of controlling a flow rate of one or more gases among a plurality of kinds of gases and supplying the one or more gases having the controlled flow rate into the treatment vessel. A plurality of branch pipelines are respectively connected to a plurality of kinds of gas sources corresponding to the plurality of kinds of gases. A main pipeline is connected to the treatment vessel and a stem pipeline to which the plurality of branch pipelines are connected is connected to one end of the main pipeline. The plurality of branch pipelines are connected to the stem pipeline in order, from a portion close to the main pipeline. One branch pipeline is connected to one gas source, and the plurality of branch pipelines may have set flow rates and maximum flow rates different from each other.

Patent Document 1 (Patent Document 1: Japanese Unexamined Patent Publication No. H9-283504) discloses a method for supplying a mixed gas, a mixed gas supplying device, and a semiconductor manufacturing apparatus including the device and using the method, as technologies using the gas supply system including the plurality of branch pipelines having different set flow rates as described above. An object of the technologies disclosed in Patent Document 1 is to prevent various phenomena which may occur in a valve or a mass flowmeter due to a reverse flow of a supply gas having a high flow rate into a line of a supply gas having a low flow rate in a mixed gas supply device for a semiconductor manufacturing apparatus. A method for supplying a mixed gas includes supplying a plurality of gases through a plurality of gas supply lines, supplying a mixed gas of the plurality of gases to a target, for which the gas is to be used, through a gas outlet, and supplying a gas having a minimum flow rate among the plurality of gases from a gas supply line which is provided at a position furthest from the gas outlet.

SUMMARY

In a first aspect, there is provided a method for arranging a treatment process, in a case of treating an object to be treated by applying a process recipe used for a first treatment apparatus to a second treatment apparatus having a configuration different from that of the first treatment apparatus. (1) The first treatment apparatus includes a first treatment vessel in which the object to be treated is treated, and a first gas supply system, the first gas supply system includes a first main pipeline, a first stem pipeline, a plurality of first branch pipelines, a plurality of first flow rate controllers, and a plurality of first gas sources, one end of the first main pipeline is connected to the first treatment vessel, another end of the first main pipeline is connected to one end of the first stem pipeline, one end of each of the plurality of first branch pipelines is connected to the first stem pipeline, another end of each of the plurality of first branch pipelines is connected to each of the plurality of first gas sources, each of the plurality of first flow rate controllers is installed with respect to each of the plurality of first branch pipelines and controls a flow rate of a gas flowing through each of the plurality of first branch pipelines, first pipe numbers are allocated to the plurality of first branch pipelines, the first pipe numbers are numbers from 1 to M and M is a natural number greater than 1 and represents a total number of the plurality of first branch pipelines, first to M-th first branch pipelines are connected to the first stem pipeline from a portion close to the first main pipeline in an order of the first pipe numbers, values of set flow rates of gases flowing from the first to M-th first branch pipelines to the first stem pipeline are different from each other, (2) the second treatment apparatus includes a second treatment vessel in which the object to be treated is treated, and a second gas supply system, the second gas supply system includes a second main pipeline, a second stem pipeline, a plurality of second branch pipelines, a plurality of second flow rate controllers, and a plurality of second gas sources, one end of the second main pipeline is connected to the second treatment vessel, another end of the second main pipeline is connected to one end of the second stem pipeline, one end of each of the plurality of second branch pipelines is connected to the second stem pipeline, another end of each of the plurality of second branch pipelines is connected to each of the plurality of second gas sources, each of the plurality of second flow rate controllers is installed with respect to each of the plurality of second branch pipelines and controls a flow rate of a gas flowing through each of the plurality of second branch pipelines, second pipe numbers are allocated to the plurality of second branch pipelines, the second pipe numbers are numbers from 1 to N and N is a natural number greater than 1 and represents a total number of the plurality of second branch pipelines, first to N-th second branch pipelines are connected to the second stem pipeline from a portion close to the second main pipeline in an order of the second pipe numbers, and values of set flow rates of gases flowing from the first to N-th second branch pipelines to the second stem pipeline are different from each other. The method according to this aspect includes a step of increasing or decreasing a flow rate of a gas of the second gas supply system, by a predetermined time from a start of a gas treatment step of the process recipe or by a predetermined time before a start of the gas treatment step, by using apparatus information regarding the first gas supply system and the second gas supply system, and arranging the treatment process, and in the step of arranging, the treatment process of the second treatment apparatus performed using the process recipe conforms to the treatment process of the first treatment apparatus performed using the process recipe.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
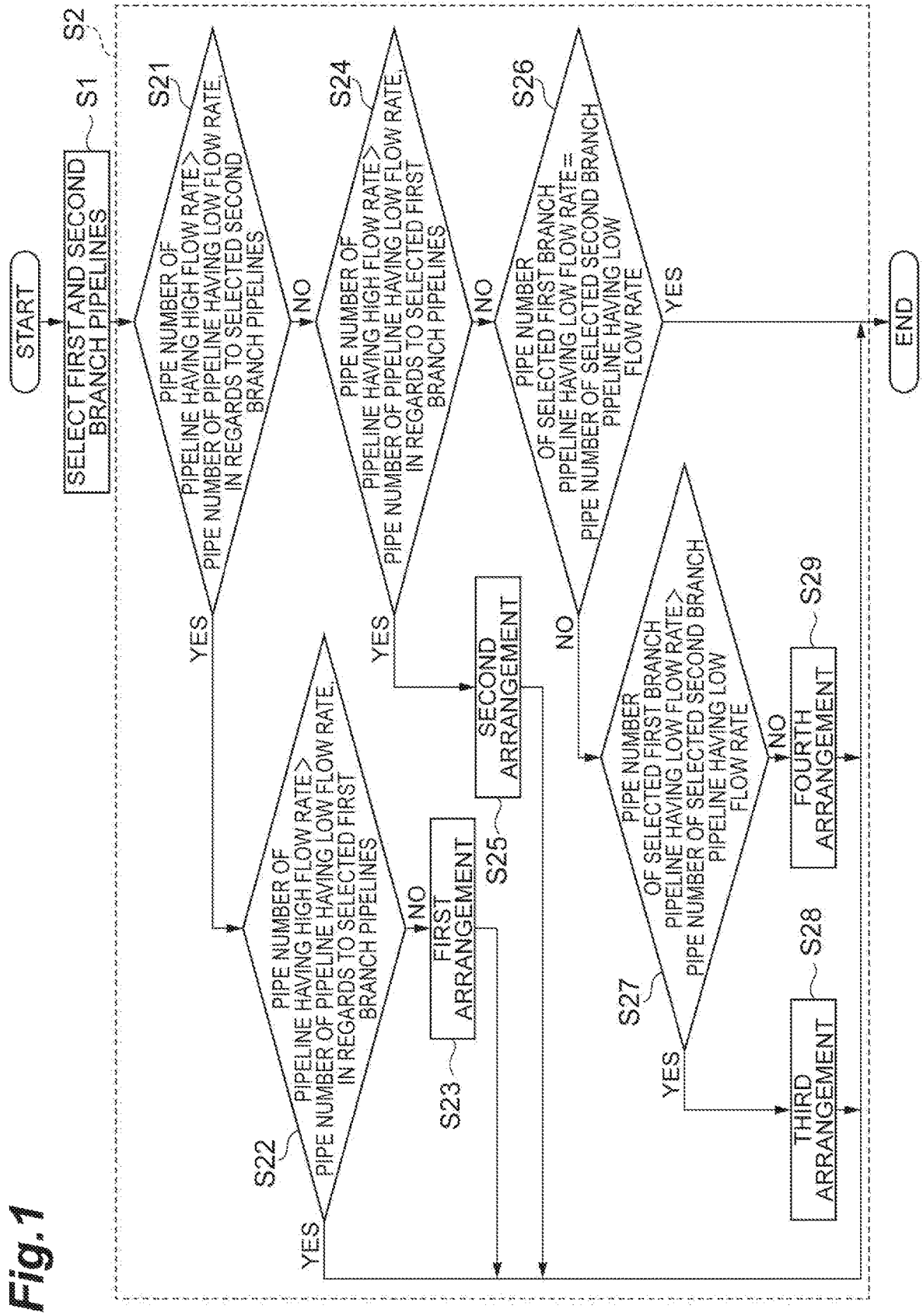
FIG. 1 is a flowchart showing a part of a method according to one exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

In the plurality of branch pipelines provided for each gas type as described above, the gas types are different from each other and set flow rates of the gases are also different from each other. The disposition or the like of the branch pipelines of gas may be different for every gas supply system, and a process recipe including a prescribed content of a gas treatment step may be suitably set for every gas supply system. Accordingly, in a case where a process recipe used for one gas supply system is used for another gas supply system, a treatment result which is different from a treatment result obtained in the one gas supply system may be obtained in the other gas supply system. Thus, it is desired to provide a technology of using one process recipe for a plurality of different gas supply systems.

In a first aspect, there is provided a method for arranging a treatment process, in a case of treating an object to be treated by applying a process recipe used for a first treatment apparatus to a second treatment apparatus having a configuration different from that of the first treatment apparatus. (1) The first treatment apparatus includes a first treatment vessel in which the object to be treated is treated, and a first gas supply system, the first gas supply system includes a first main pipeline, a first stem pipeline, a plurality of first branch pipelines, a plurality of first flow rate controllers, and a plurality of first gas sources, one end of the first main pipeline is connected to the first treatment vessel, another end of the first main pipeline is connected to one end of the first stem pipeline, one end of each of the plurality of first branch pipelines is connected to the first stem pipeline, another end of each of the plurality of first branch pipelines is connected to each of the plurality of first gas sources, each of the plurality of first flow rate controllers is installed with respect to each of the plurality of first branch pipelines and controls a flow rate of a gas flowing through each of the plurality of first branch pipelines, first pipe numbers are allocated to the plurality of first branch pipelines, the first pipe numbers are numbers from 1 to M and M is a natural number greater than 1 and represents a total number of the plurality of first branch pipelines, first to M-th first branch pipelines are connected to the first stem pipeline from a portion close to the first main pipeline in an order of the first pipe numbers, values of set flow rates of gases flowing from the first to M-th first branch pipelines to the first stem pipeline are different from each other, (2) the second treatment apparatus includes a second treatment vessel in which the object to be treated is treated, and a second gas supply system, the second gas supply system includes a second main pipeline, a second stem pipeline, a plurality of second branch pipelines, a plurality of second flow rate controllers, and a plurality of second gas sources, one end of the second main pipeline is connected to the second treatment vessel, another end of the second main pipeline is connected to one end of the second stem pipeline, one end of each of the plurality of second branch pipelines is connected to the second stem pipeline, another end of each of the plurality of second branch pipelines is connected to each of the plurality of second gas sources, each of the plurality of second flow rate controllers is installed with respect to each of the plurality of second branch pipelines and controls a flow rate of a gas flowing through each of the plurality of second branch pipelines, second pipe numbers are allocated to the plurality of second branch pipelines, the second pipe numbers are numbers from 1 to N and N is a natural number greater than 1 and represents a total number of the plurality of second branch pipelines, first to N-th second branch pipelines are connected to the second stem pipeline from a portion close to the second main pipeline in an order of the second pipe numbers, and values of set flow rates of gases flowing from the first to N-th second branch pipelines to the second stem pipeline are different from each other. The method according to this aspect includes a step of increasing or decreasing a flow rate of a gas of the second gas supply system, by a predetermined time from a start of a gas treatment step of the process recipe or by a predetermined time before a start of the gas treatment step, by using apparatus information regarding the first gas supply system and the second gas supply system, and arranging the treatment process, and in the step of arranging, the treatment process of the second treatment apparatus performed using the process recipe conforms to the treatment process of the first treatment apparatus performed using the process recipe.

In the method, in a case of treating an object to be treated by applying a process recipe used for the first treatment apparatus to the second treatment apparatus, in the first treatment apparatus and the second treatment apparatus in which dispositions of the branch pipelines of the gas supply systems may be different from each other, a flow rate of a gas of the second gas supply system is increased or decreased (including a case of delaying a gas supply start time due to the increase or decrease of a flow rate of a gas), by a predetermined time from a start of a gas treatment step of a process recipe or by a predetermined time before a start of the gas treatment step, by using apparatus information relating to the first gas supply system and the second gas supply system, and the treatment process of the second treatment apparatus is arranged. Thus, even when a process recipe used for the first treatment apparatus is used for the second treatment apparatus, the same treatment process as that of the first treatment apparatus is performed regarding the second treatment apparatus.

In one exemplary embodiment, the step of arranging includes (3) a first step of selecting a M1-th (M1 is a natural number satisfying a relationship of $1 \le M1 \le M-1$) first branch pipeline and a M2-th (M2 is a natural number satisfying relationships of 2≤M2≤M and M1<M2) first branch pipeline corresponding to two kinds of gas types among the plurality of first branch pipelines, and a N1-th (N1 is a natural number satisfying a relationship of 1≤N1≤N−1) second branch pipeline and a N2-th (N2 is a natural number satisfying relationships of 2≤N2≤N and N1<N2) second branch pipeline corresponding to two kinds of gas types among the plurality of second branch pipelines, in a case where two kinds of the gas types are used in the gas treatment step of the process recipe, and (4) a second step of arranging the treatment process of the second treatment apparatus performed using the process recipe, based on a combination of the first pipe numbers M1 and M2 and values of the set flow rates corresponding to an M1-th first branch pipeline and an M2-th first branch pipeline selected among the plurality of first branch pipelines in the first step, and the second pipe numbers N1 and N2 and values of the set flow rates corresponding to an N1-th second branch pipeline and an N2-th second branch pipeline selected among the plurality of second branch pipelines in the first step. As described above, a difference between the configuration of the first gas supply system and the configuration of the second gas supply system is accurately specified in the first step, the treatment process of the second treatment apparatus is arranged based on the difference specified in the first step, in the second step, and accordingly, the arrangement is accurately performed.

In one exemplary embodiment, in the second step, and in a case where a value of the set flow rate corresponding to the N2-th second branch pipeline is greater than a value of the set flow rate corresponding to the N1-th second branch pipeline and a value of the set flow rate corresponding to the M1-th first branch pipeline is greater than a value of the set flow rate corresponding to the M2-th first branch pipeline, the treatment process of the second treatment apparatus performed using the process recipe is arranged, so that a time from a start time of the gas treatment step of the process recipe until a flow rate of a gas from the N2-th second branch pipeline flowing to the second stem pipeline reaches the set flow rate, is set as a time necessary for a case where gas amount in the first stem pipeline is supplied at the set flow rate corresponding to the M2-th first branch pipeline, when pressure is stable. As described above, in a case where the supply of the gas from the first gas supply system to the first treatment vessel is delayed, compared to the supply of the gas from the second gas supply system to the second treatment vessel due to a difference in the pipe numbers of the branch pipelines (difference in position of the branch pipelines with respect to the main pipeline) and a difference in values of the set flow rates, the set flow rate of the second gas supply system is controlled in accordance with the delay occurred on the first treatment apparatus side, and thus, the treatment process of the second treatment apparatus performed using the process recipe for the first treatment apparatus conforms to the treatment process of the first treatment apparatus.

In one exemplary embodiment, in the second step, and in a case where a value of the set flow rate corresponding to the N1-th second branch pipeline is greater than a value of the set flow rate corresponding to the N2-th second branch pipeline and a value of the set flow rate corresponding to the M2-th first branch pipeline is greater than a value of the set flow rate corresponding to the M1-th first branch pipeline, the treatment process of the second treatment apparatus performed using the process recipe is arranged so that the flow rate of the gas flowing from the N2-th second branch pipeline becomes a value of a maximum flow rate of the gas flowing from the N2-th second branch pipeline to the second stem pipeline, during the time from a start time of the gas treatment step of the process recipe until a time necessary for a case where gas amount in the second stem pipeline is supplied at a difference flow rate obtained by subtracting a value of the set flow rate corresponding to the N2-th second branch pipeline from a value of a maximum flow rate of the gas flowing from the N2-th second branch pipeline to the second stem pipeline, when pressure is stable, has elapsed. As described above, in a case where the supply of the gas from the second gas supply system to the second treatment vessel is delayed, compared to the supply of the gas from the first gas supply system to the first treatment vessel due to a difference in the pipe numbers of the branch pipelines (difference in position of the branch pipelines with respect to the main pipeline) and a difference in values of the set flow rates, the flow rate of the gas of the second gas supply system is controlled to increase to be higher than the setting from a start time of the gas treatment step to compensate the delay on the second treatment apparatus side, and thus, the treatment process of the second treatment apparatus performed using the process recipe for the first treatment apparatus conforms to the treatment process of the first treatment apparatus.

In one exemplary embodiment, in the second step, and in a case where a value of the set flow rate corresponding to the N1-th second branch pipeline is greater than a value of the set flow rate corresponding to the N2-th second branch pipeline and a value of the set flow rate corresponding to the M2-th first branch pipeline is greater than a value of the set flow rate corresponding to the M1-th first branch pipeline, the treatment process of the second treatment apparatus performed using the process recipe is arranged so that the flow rate of the gas flowing from the N2-th second branch pipeline becomes a value of a maximum flow rate of the gas flowing from the N2-th second branch pipeline to the second stem pipeline, during the time from a non-start time of the gas treatment step of the process recipe until a time necessary for a case where gas amount in the second stem pipeline is supplied at a maximum flow rate of the gas flowing from the N2-th second branch pipeline to the second stem pipeline, when pressure is stable, has elapsed and the gas treatment step is started. As described above, in a case where the supply of the gas from the second gas supply system to the second treatment vessel is delayed, compared to the supply of the gas from the first gas supply system to the first treatment vessel due to a difference in the pipe numbers of the branch pipelines (difference in position of the branch pipelines with respect to the main pipeline) and a difference in values of the set flow rates, the controlling is performed so that the gas supply of the second gas supply system is started at a non-start time of the gas treatment step to compensate the delay on the second treatment apparatus side until a start time of the gas treatment step, and thus, the treatment process of the second treatment apparatus performed using the process recipe for the first treatment apparatus conforms to the treatment process of the first treatment apparatus.

In one exemplary embodiment, in the second step, and in a case where a value of the set flow rate corresponding to the M1-th first branch pipeline is greater than a value of the set flow rate corresponding to the M2-th first branch pipeline, a value of the set flow rate corresponding to the N1-th second branch pipeline is greater than a value of the set flow rate corresponding to the N2-th second branch pipeline, and M2 is greater than N2, a difference gas amount obtained by subtracting gas amount in the second stem pipeline, when pressure is stable, from gas amount in the first stem pipeline, when pressure is stable, is calculated, and the treatment process of second treatment apparatus performed using the process recipe is arranged, so that the time from a start time of the gas treatment step of the process recipe until a flow rate of a gas from the N2-th second branch pipeline flowing to the second stem pipeline reaches the set flow rate, is set as a time necessary for a case where the difference gas amount is supplied at the set flow rate corresponding to the M2-th first branch pipeline. As described above, in a case where the supply of the gas from the first gas supply system to the first treatment vessel is delayed, compared to the supply of the gas from the second gas supply system to the second treatment vessel due to a difference in the pipe numbers of the branch pipelines (difference in position of the branch pipelines with respect to the main pipeline) and a difference in values of the set flow rates, the set flow rate of the second gas supply system is controlled in accordance with the delay occurred on the first treatment apparatus side, and thus, the treatment process of the second treatment apparatus performed using the process recipe for the first treatment apparatus may conform to the treatment process of the first treatment apparatus.

In one exemplary embodiment, in the second step, and in a case where a value of the set flow rate corresponding to the M1-th first branch pipeline is greater than a value of the set flow rate corresponding to the M2-th first branch pipeline, a value of the set flow rate corresponding to the N1-th second branch pipeline is greater than a value of the set flow rate corresponding to the N2-th second branch pipeline, and N2 is greater than M2, a difference gas amount obtained by subtracting gas amount in the first stem pipeline, when pressure is stable, from gas amount in the second stem pipeline, when pressure is stable, is calculated, and the treatment process of the second treatment apparatus performed using the process recipe is arranged, so that the flow rate of the gas flowing from the N2-th second branch pipeline becomes a value of a maximum flow rate of the gas flowing from the N2-th second branch pipeline to the second stem pipeline, during the time from a start time of the gas treatment step of the process recipe until a time necessary for a case where the difference gas amount is supplied at a difference flow rate obtained by subtracting a value of the set flow rate corresponding to the N2-th second branch pipeline from a value of a maximum flow rate of the gas flowing from the N2-th second branch pipeline to the second stem pipeline has elapsed. As described above, in a case where the supply of the gas from the second gas supply system to the second treatment vessel is delayed, compared to the supply of the gas from the first gas supply system to the first treatment vessel due to a difference in the pipe numbers of the branch pipelines (difference in position of the branch pipelines with respect to the main pipeline) and a difference in values of the set flow rates, the flow rate of the gas of the second gas supply system is controlled to increase to be higher than the setting from a start time of the gas treatment step to compensate the delay on the second treatment apparatus side, and thus, the treatment process of the second treatment apparatus performed using the process recipe for the first treatment apparatus may conform to the treatment process of the first treatment apparatus.

In one exemplary embodiment, in the second step, and in a case where a value of the set flow rate corresponding to the M1-th first branch pipeline is greater than a value of the set flow rate corresponding to the M2-th first branch pipeline, a value of the set flow rate corresponding to the N1-th second branch pipeline is greater than a value of the set flow rate corresponding to the N2-th second branch pipeline, and N2 is greater than M2, a difference gas amount obtained by subtracting gas amount in the first stem pipeline, when pressure is stable, from gas amount in the second stem pipeline, when pressure is stable, is calculated, and the treatment process of the second treatment apparatus performed using the process recipe is arranged, so that the flow rate of the gas flowing from the N2-th second branch pipeline becomes a value of a maximum flow rate of the gas flowing from the N2-th second branch pipeline to the second stem pipeline, during the time from a non-start time of the gas treatment step of the process recipe until a time necessary for a case where the difference gas amount is supplied at a maximum flow rate of the gas flowing from the N2-th second branch pipeline to the second stem pipeline has elapsed and the gas treatment step is started. As described above, in a case where the supply of the gas from the second gas supply system to the second treatment vessel is delayed, compared to the supply of the gas from the first gas supply system to the first treatment vessel due to a difference in the pipe numbers of the branch pipelines (difference in position of the branch pipelines with respect to the main pipeline) and a difference in values of the set flow rates, the controlling is performed so that the gas supply of the second gas supply system is started at a non-start time of the gas treatment step to compensate the delay on the second treatment apparatus side until a start time of the gas treatment step, and thus, the treatment process of the second treatment apparatus performed using the process recipe for the first treatment apparatus conforms to the treatment process of the first treatment apparatus.

In one exemplary embodiment, in the step of arranging, a difference between volume of the first main pipeline and volume of the second main pipeline is determined, and the treatment process of the second treatment apparatus performed using the process recipe is arranged, based on this determined result. Since a speed of the supply of the gas from the gas supply system to the treatment vessel changes depending on volume of main pipelines directly connected to the treatment vessels, the treatment process of the second treatment apparatus performed using the process recipe for the first treatment apparatus is arranged based on the determined result of a difference between volume of the first main pipeline and volume of the second main pipeline, and thus, the treatment process of the second treatment apparatus performed using the process recipe for the first treatment apparatus conforms to the treatment process of the first treatment apparatus.

In one exemplary embodiment, in the step of arranging, and in a case where volume of the first main pipeline is greater than volume of the second main pipeline, a difference main gas amount obtained by subtracting main gas amount in the second main pipeline, when pressure is stable, from main gas amount in the first main pipeline, when pressure is stable, is calculated, and the treatment process of the second treatment apparatus performed using the process recipe is arranged, so that the time from a start time of the gas treatment step of the process recipe until a main flow rate of a gas flowing through the second main pipeline reaches a set main flow rate corresponding to the second main pipeline, is set as a time necessary for a case where the difference main gas amount is supplied at a set main flow rate corresponding to the first main pipeline. As described above, in a case where the supply of the gas from the first gas supply system to the first treatment vessel is delayed, compared to the supply of the gas from the second gas supply system to the second treatment vessel due to a difference in volume of the main pipelines directly connected to the treatment vessels, the set flow rate of the second gas supply system is controlled in accordance with the delay occurred on the first treatment apparatus side, and thus, the treatment process of the second treatment apparatus performed using the process recipe for the first treatment apparatus may conform to the treatment process of the first treatment apparatus.

In one exemplary embodiment, in the step of arranging, and in a case where volume of the second main pipeline is greater than volume of the first main pipeline, a difference main gas amount obtained by subtracting main gas amount in the first main pipeline, when pressure is stable, from main gas amount in the second main pipeline, when pressure is stable, is calculated, and the treatment process of the second treatment apparatus performed using the process recipe is arranged, so that a main flow rate of the gas flowing through the second main pipeline becomes a value of a maximum main flow rate of the gas flowing to the second main pipeline, during the time from a start time of the gas treatment step of the process recipe until a time necessary for a case where the difference main gas amount is supplied at a difference main flow rate obtained by subtracting a value of a set main flow rate corresponding to the second main pipeline from a value of a maximum main flow rate of the gas flowing to the second main pipeline has elapsed. As described above, in a case where the supply of the gas from the second gas supply system to the second treatment vessel is delayed, compared to the supply of the gas from the first gas supply system to the first treatment vessel due to a difference in volume of the main pipelines directly connected to the treatment vessels, the flow rate of the gas of the second gas supply system is controlled to increase to be higher than the setting from a start time of the gas treatment step to compensate the delay on the second treatment apparatus side, and thus, the treatment process of the second treatment apparatus performed using the process recipe for the first treatment apparatus may conform to the treatment process of the first treatment apparatus.

In one exemplary embodiment, in the step of arranging, and in a case where volume of the second main pipeline is greater than volume of the first main pipeline, a difference main gas amount obtained by subtracting main gas amount in the first main pipeline, when pressure is stable, from main gas amount in the second main pipeline, when pressure is stable, is calculated, and the treatment process of the second treatment apparatus performed using the process recipe is arranged, so that a main flow rate of the gas flowing through the second main pipeline becomes a value of a maximum main flow rate of the gas flowing through the second main pipeline, during the time from a non-start time of the gas treatment step of the process recipe until a time necessary for a case where the difference main gas amount is supplied at a maximum main flow rate of the gas flowing through the second main pipeline has elapsed and the gas treatment step is started. As described above, in a case where the supply of the gas from the second gas supply system to the second treatment vessel is delayed, compared to the supply of the gas from the first gas supply system to the first treatment vessel due to a difference in volume of the main pipelines directly connected to the treatment vessels, the controlling is performed so that the gas supply of the second gas supply system is started from a non-start time of the gas treatment step to compensate the delay on the second treatment apparatus side until a start time of the gas treatment step, and thus, the treatment process of the second treatment apparatus performed using the process recipe for the first treatment apparatus may conform to the treatment process of the first treatment apparatus.

In one exemplary embodiment, at a completion time of the gas treatment step, a first attenuated main flow rate of a gas of the first main pipeline attenuated from a stop time of supply of the gas of the first gas supply system and a second attenuated main flow rate of a gas of the second main pipeline attenuated from a stop time of supply of the gas of the second gas supply system are compared to each other, a difference attenuated main flow rate obtained by subtracting the second attenuated main flow rate from the first attenuated main flow rate is calculated, in a case where the first attenuated main flow rate is higher than the second attenuated main flow rate, and the treatment process of the second treatment apparatus performed using the process recipe is arranged, so that a gas of the second gas supply system at the difference attenuated main flow rate flows to the second main pipeline, from a stop time of supply of the gas. As described above, in a case where the first attenuated main flow rate is higher than the second attenuated main flow rate, the second gas supply system is controlled so that the gas at the difference attenuated main flow rate obtained by subtracting the second attenuated main flow rate from the first attenuated main flow rate flows to the second main pipeline, from a stop time of supply of the gas, and thus, the treatment process of the second treatment apparatus performed using the process recipe for the first treatment apparatus conforms to the treatment process of the first treatment apparatus.

As described above, a technology of using one process recipe for a plurality of different gas supply systems is provided.

Hereinafter, various exemplary embodiments will be described in detail with reference to the drawings. In each drawing, the same reference numeral is used for the same or corresponding portions.

Figure 2:
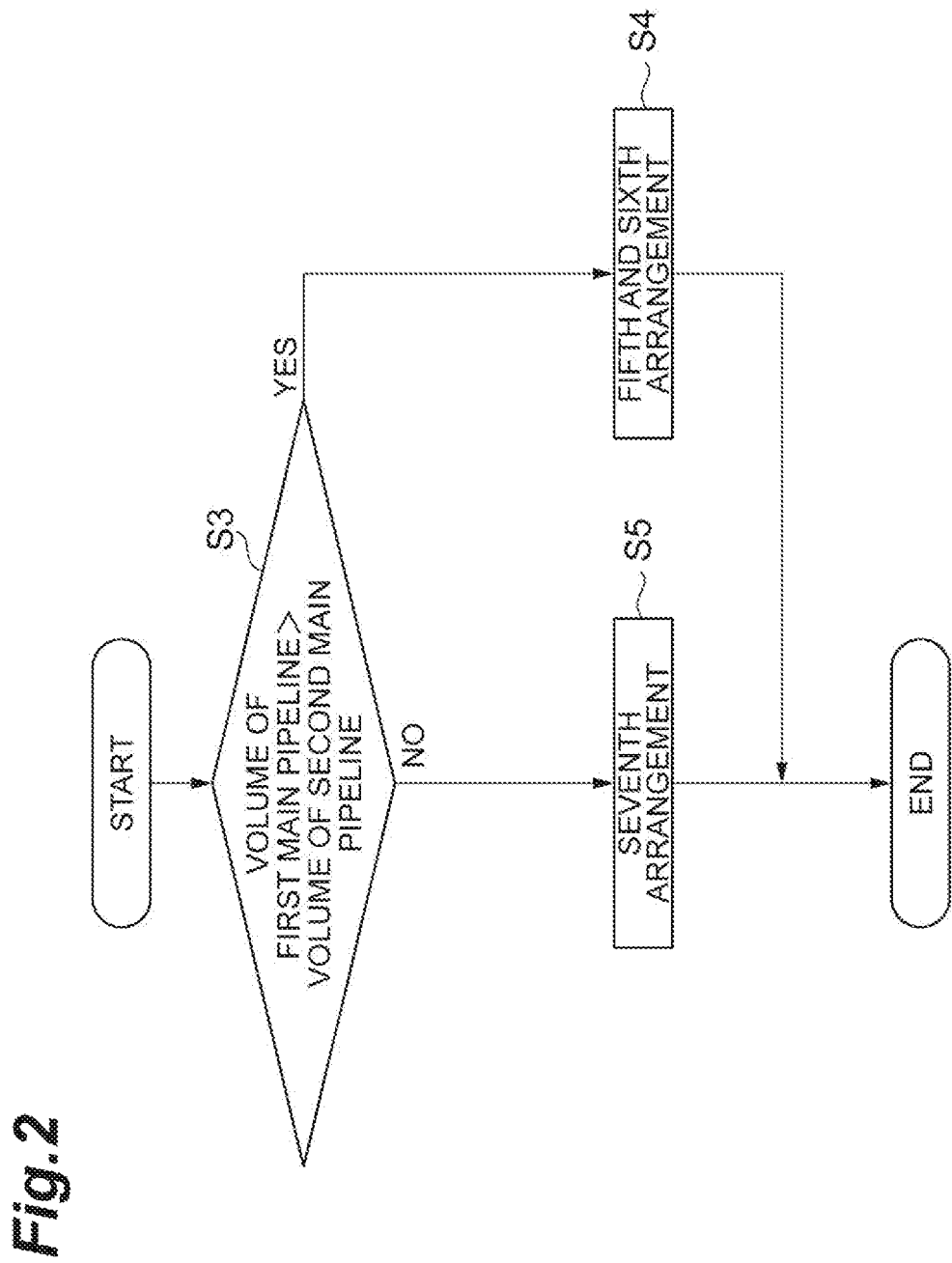
FIG. 2 is a flowchart showing another part of the method according to one exemplary embodiment.
Figure 3B:
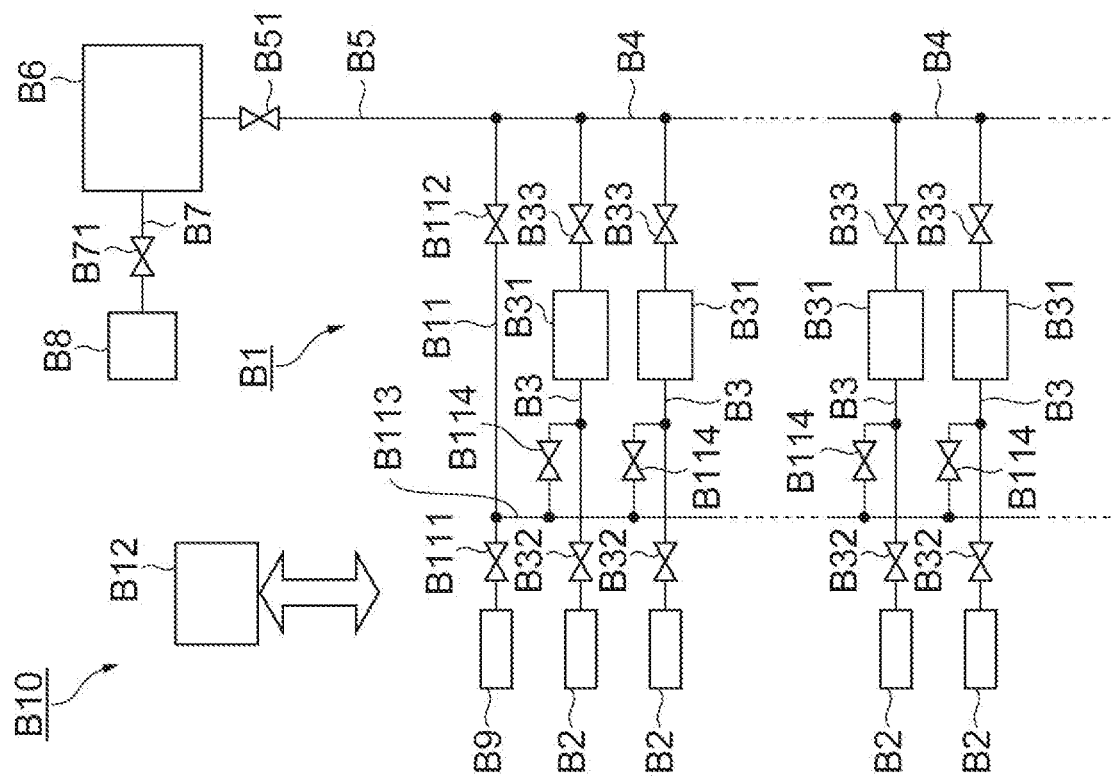
FIG. 3B shows an example of another substrate treatment apparatus.
Figure 3A:
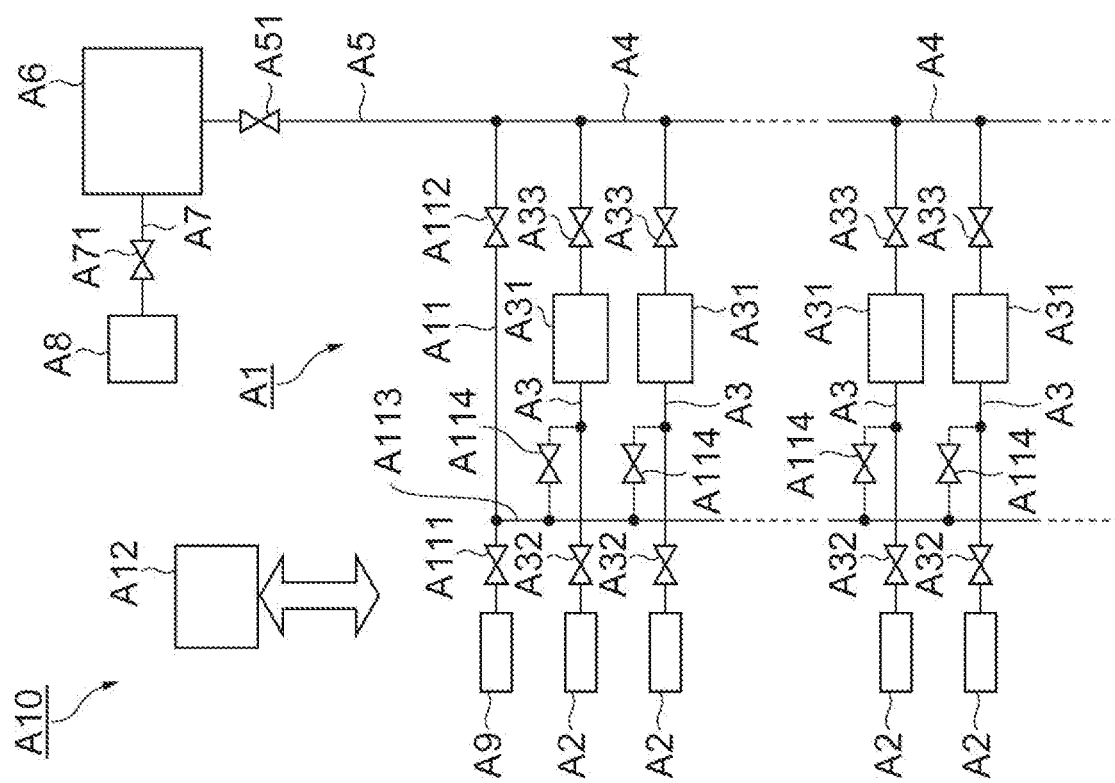
FIG. 3A shows an example of a substrate treatment apparatus.

FIG. 1 and FIG. 2 are respectively flowcharts showing the method according to one exemplary embodiment. A method MT of one exemplary embodiment shown in FIG. 1 and FIG. 2 is a method for arranging a treatment process. FIG. 3A shows an example of a substrate treatment apparatus and FIG. 3B shows an example of another substrate treatment apparatus. FIG. 3A schematically shows a configuration of a substrate treatment apparatus A10 (first treatment apparatus) which can be used in various exemplary embodiments of a method for treating a substrate, and FIG. 3B schematically shows a configuration of a substrate treatment apparatus B10 (second treatment apparatus) which can be used in various exemplary embodiments of the method for treating a substrate.

First, a main configuration of the substrate treatment apparatus A10 (first treatment apparatus) will be described with reference to FIG. 3A. The substrate treatment apparatus A10 includes a gas supply system A1 (first gas supply system), a treatment vessel A6 (first treatment vessel), a piping A7, a pressure regulating valve A71, and an exhaust device A8. The gas supply system A1 includes M (M is a natural number satisfying a relationship of M>1, this applies the same hereinafter) gas sources A2 (a plurality of first gas sources), M branch pipelines A3 (a plurality of first branch pipelines), M flow rate controllers A31 (a plurality of first flow rate controllers), M valves A32, M valves A33, a stem pipelines A4 (first stem pipeline), a main pipeline A5 (first main pipeline), a valve A51, a purge gas source A9, a piping A11, a valve A111, a valve A112, a piping A113, M valves A114, and a control unit A12. M is a natural number greater than 1 and represents a total number of the plurality of branch pipelines A3 included in the gas supply system A1. The gas supply system A1 has a configuration of supplying various gases to the treatment vessel A6. The treatment vessel A6 is a vessel in which an object to be treated (wafer) is treated.

One end of the main pipeline A5 is connected to the treatment vessel A6 through the valve A51. The other end of the main pipeline A5 is connected to one end of the stem pipeline A4. One end of each of the M branch pipelines A3 is connected to the stem pipeline A4. The other end of each of the M branch pipelines A3 is connected to each of the M gas sources A2. Each of the M flow rate controllers A31 is installed with respect to each of the M branch pipelines A3 and controls a flow rate of a gas flowing through each of the M branch pipelines A3, in accordance with an instruction from the control unit A12. Pipe numbers (first pipe numbers) are allocated to the M branch pipelines A3. The first pipe numbers are numbers from 1 to M. First to M-th branch pipelines A3 are connected to the stein pipeline A4 from a portion close to the main pipeline A5 in an order of the first pipe numbers. The first to M-th branch pipelines A3 respectively have different set flow rates from each other. A connection portion between the stem pipeline A4 and the main pipeline A5 is a connection portion between the first branch pipeline A3 and the stem pipeline A4.

On the branch pipeline A3, the valve A32 and the valve A33 are installed in front of and behind the flow rate controller A31. All of the valves A32, the valves A33, and the valve A51 are in a state of OPEN at the time of performing a gas treatment step and are in a state of CLOSE in steps other than the gas treatment step. The treatment vessel A6 is connected to the exhaust device A8 through the piping A7. On the piping A7, the pressure regulating valve A71 is provided between the treatment vessel A6 and the exhaust device A8. The pressure regulating valve A71 is in a state of OPEN at the time of performing an exhaust treatment step and is in a state of CLOSE in steps other than the exhaust treatment step.

One end of the piping A11 is connected to the purge gas source A9 through the valve A111. The other end of the piping A11 is connected to the main pipeline A5 through the valve A112. The piping A11 is connected to the piping A113 between the valve A111 and the valve A112. The piping A113 is connected to the branch pipeline A3 between the valve A32 and the flow rate controller A31 through the valve A114.

The control unit A12 is a computer device including a CPU, a ROM, and a RAM (memory). The control unit A12, specifically, the CPU of the control unit A12 generally controls the substrate treatment apparatus A10 using various computer programs and data items stored in the memory of the control unit A12.

Next, a main configuration of the substrate treatment apparatus B10 (second treatment apparatus) will be described with reference to FIG. 3B. Each constituent element (for example, a gas supply system B1) of the substrate treatment apparatus B10 corresponds to a constituent element having a reference numeral in which "A" of the reference numeral used for each constituent element of the substrate treatment apparatus A10 is substituted with "B". For example, the gas supply system A1 of the substrate treatment apparatus A10 corresponds to the gas supply system B1 of the substrate treatment apparatus B10.

The substrate treatment apparatus B10 includes the gas supply system B1 (second gas supply system), a treatment vessel B6 (second treatment vessel), a piping B7, a pressure regulating valve B71, and an exhaust device B8. The gas supply system B1 includes N (N is a natural number satisfying a relationship of N>1, this applies the same hereinafter) gas sources B2 (a plurality of second gas sources), N branch pipelines B3 (a plurality of second branch pipelines), N flow rate controllers B31 (a plurality of second flow rate controllers), N valves B32, N valves B33, a stem pipelines B4 (second stem pipeline), a main pipeline B5 (second main pipeline), a valve B51, a purge gas source B9, a piping B11, a valve B111, a valve B112, a piping B113, N valves B114, and a control unit B12. N is a natural number greater than 1 and represents a total number of the plurality of branch pipelines B3 included in the gas supply system B1. The gas supply system B1 has a configuration of supplying various gases to the treatment vessel B6. The treatment vessel B6 is a vessel in which an object to be treated (wafer) is treated.

One end of the main pipeline B5 is connected to the treatment vessel B6 through the valve B51. The other end of the main pipeline B5 is connected to one end of the stem pipeline B4. One end of each of the N branch pipelines B3 is connected to the stem pipeline B4. The other end of each of the N branch pipelines B3 is connected to each of the N gas sources B2. Each of the N flow rate controllers B31 is installed with respect to each of the N branch pipelines B3 and controls a flow rate of a gas flowing through each of the N branch pipelines B3, in accordance with an instruction from the control unit B12. Pipe numbers (second pipe numbers) are allocated to the N branch pipelines B3. The second pipe numbers are numbers from 1 to N. First to N-th branch pipelines B3 are connected to the stem pipeline B4 from a portion close to the main pipeline B5 in an order of the second pipe numbers. The first to N-th branch pipelines B3 respectively have different set flow rates from each other. A connection portion between the stem pipeline B4 and the main pipeline B5 is a connection portion between the first branch pipeline B3 and the stem pipeline B4.

On the branch pipeline B3, the valve B32 and the valve B33 are installed in front of and behind the flow rate controller B31. All of the valves B32, the valves B33, and the valve B51 are in a state of OPEN at the time of performing a gas treatment step and are in a state of CLOSE in steps other than the gas treatment step. The treatment vessel B6 is connected to the exhaust device B8 through the piping B7. On the piping B7, the pressure regulating valve B71 is provided between the treatment vessel B6 and the exhaust device B8. The pressure regulating valve B71 is in a state of OPEN at the time of performing an exhaust treatment step and is in a state of CLOSE in steps other than the exhaust treatment step.

One end of the piping B11 is connected to the purge gas source B9 through the valve B111. The other end of the piping B11 is connected to the main pipeline B5 through the valve B112. The piping B11 is connected to the piping B113 between the valve B111 and the valve B112. The piping B113 is connected to the branch pipeline B3 between the valve B32 and the flow rate controller B31 through the valve B114.

The control unit B12 is a computer device including a CPU, a ROM, and a RAM (memory). The control unit B12, specifically, the CPU of the control unit B12 generally controls the substrate treatment apparatus B10 using various computer programs and data items stored in the memory of the control unit B12. Particularly, the memory of the control unit B12 stores a process recipe which will be described later, apparatus information, and computer programs and various data items for performing an arrangement treatment which will be described later shown in the flowcharts of FIGS. 1 and 2, and the CPU of the control unit B12 performs the arrangement treatment shown in the flowcharts of FIGS. 1 and 2 by using the process recipe, the apparatus information, and the computer programs and various data items for performing the arrangement treatment shown in the flowcharts of FIGS. 1 and 2 which are stored in the memory of the control unit B12.

Next, the method MT (arrangement treatment) of one exemplary embodiment will be described with reference to FIGS. 1, 2, and 4 to 6. A horizontal axis of FIGS. 4 to 6 indicates the elapse of time. The method MT is a method of arranging a treatment process of the substrate treatment apparatus B10, in a case of treating an object to be treated (substrate) by applying a process recipe used for the substrate treatment apparatus A10 (process recipe of substrate treatment apparatus A10) to the substrate treatment apparatus B10 having a configuration different from that of the substrate treatment apparatus A10. FIG. 1 is a flowchart showing a part of the method MT according to one exemplary embodiment. FIG. 2 is a flowchart showing another part of the method MT according to one exemplary embodiment. The method MT shown in FIGS. 1 and 2 is performed by controlling the plurality of flow rate controllers B31 and the plurality of valves B32, B33, and B51 in the gas supply system B1, and the pressure regulating valve B71 by the control unit B12. In the method MT, all of the valves B111, B112, and B114 are closed. Hereinafter, the valves B32, B33, and B51 may be collectively referred to as the total valves.

First, the memory of the control unit B12 stores apparatus information regarding the gas supply system B1 of the substrate treatment apparatus B10. When i is set as the second pipe number of the branch pipelines B3, the apparatus information includes the second pipe number (i), the gas type relating to the i-th branch pipeline B3, a length of the i-th branch pipeline B3, a diameter of the i-th branch pipeline B3, a volume except for a volume of flow path relating to the i-th branch pipeline B3, a set flow rate of the i-th branch pipeline B3, a maximum flow rate of the i-th branch pipeline B3, a coefficient of viscosity relating to the i-th branch pipeline B3, a set main flow rate of the main pipeline B5, a maximum main flow rate of the main pipeline B5, and a coefficient of viscosity relating to the main pipeline B5.

The second pipe number is applied to each of the branch pipelines B3.

The gas type relating to the i-th branch pipeline B3 is the gas type of the gas source B2 connected to the branch pipeline B3.

The length of the i-th branch pipeline B3 is a length between a joint between the i-th branch pipeline B3 and the stem pipeline B4, and a joint between a j-th (j is a natural number different from 1) branch pipeline B3 through which gas flows at a set flow rate higher than the set flow rate in the i-th branch pipeline B3 and the stem pipeline B4.

The diameter of the i-th branch pipeline B3 is a diameter of a cross section of the stem pipeline B4.

Volume except for a volume of flow path relating to the i-th branch pipeline B3 is a value obtained by excluding a volume between the joint between the i-th branch pipeline B3 and the stem pipeline B4 and a joint between the first branch pipeline B3 and the stem pipeline B4, from a volume of the stem pipeline B4.

The set flow rate of the i-th branch pipeline B3 is a predetermined flow rate of a gas flowing from the i-th branch pipeline B3 to the stem pipeline B4, when pressure is stable.

A maximum flow rate of the i-th branch pipeline B3 is an allowed maximum flow rate of the flow rate of the gas flowing from the i-th branch pipeline B3 to the stem pipeline B4.

The coefficient of viscosity relating to the i-th branch pipeline B3 is a coefficient of viscosity of the gas type corresponding to the i-th branch pipeline B3.

A set main flow rate of the main pipeline B5 is a predetermined main flow rate of a gas flowing through the main pipeline B5, when pressure is stable.

A maximum flow rate of the main pipeline B5 is an allowed maximum main flow rate of a main flow rate of the gas flowing through the main pipeline B5 (a maximum main flow rate allowed in a state where a gas ratio is held).

The coefficient of viscosity relating to the main pipeline B5 is a coefficient of viscosity of the gas flowing through the main pipeline B5.

The apparatus information further includes a length of the main pipeline B5 and a diameter of the main pipeline B5. The length of the main pipeline B5 includes a substantial length of the main pipeline B5 (length between one end and the other end of the main pipeline B5), and a length between the joint between the i-th branch pipeline B3 and the stem pipeline B4 and the treatment vessel B6 (length defined for each of N branch pipelines B3). Hereinafter, the length of the main pipeline B5 means the substantial length of the main pipeline B5, unless otherwise noted. The diameter of the main pipeline B5 is a diameter of cross section of the main pipeline B5.

The memory of the control unit B12 also stores apparatus information regarding the gas supply system A1 of the substrate treatment apparatus A10. The apparatus information regarding the gas supply system A1 is the same as the apparatus information regarding the gas supply system B1 and the description thereof will be omitted.

The method MT includes a step of increasing or decreasing a flow rate of a gas of the gas supply system B1, by a predetermined time from a start of a gas treatment step of a process recipe applied to the substrate treatment apparatus B10 or by a predetermined time before a start of the gas treatment step, by using apparatus information including a set flow rate of each of the plurality of branch pipelines A3 and the plurality of branch pipelines B3, the first pipe numbers and the second pipe numbers respectively allocated to the plurality of branch pipelines A3 and the plurality of branch pipelines B3, and volume of the main pipeline A5, and volume of the main pipeline B5, and arranging a treatment process of the substrate treatment apparatus B10 (all of the steps shown in the flow chart of FIG. 1 and all of the steps shown in the flow chart of FIG. 2). In this step, the treatment process of the substrate treatment apparatus B10 performed using the process recipe conforms to the treatment process of the substrate treatment apparatus A10 performed using the process recipe. The process recipe used in this exemplary embodiment is made based on the configuration of the gas supply system A1 of the substrate treatment apparatus A10 and is a recipe to be used in a gas treatment step performed by the substrate treatment apparatus A10.

Accordingly, in a case of treating an object to be treated by applying a process recipe used for the substrate treatment apparatus A10 to the substrate treatment apparatus B10, in the substrate treatment apparatus A10 and the substrate treatment apparatus B10 in which dispositions of the branch pipelines of the gas supply systems may be different from each other, a flow rate of a gas of the gas supply system B1 is increased or decreased (including a case of delaying a gas supply start time due to the increase or decrease of a flow rate of a gas), by a predetermined time from a start of a gas treatment step of a process recipe or by a predetermined time before a start of the gas treatment step, by using apparatus information relating to the gas supply system A1 and the gas supply system B1, and the treatment process of the substrate treatment apparatus B10 is arranged. Thus, even when a process recipe used for the substrate treatment apparatus A10 is used for the substrate treatment apparatus B10, the same treatment process as that of the substrate treatment apparatus A10 is performed regarding the substrate treatment apparatus B10.

Hereinafter, the method MT will be described along the flowchart shown in FIG. 1. The treatments shown in the flowchart of FIG. 1 are performed by controlling the N flow rate controllers B31, the N valves B32, the N valves B33, the valve B51, the pressure regulating valve B71, and the exhaust device B8 by the control unit B12. All of the treatments shown in the flowchart of FIG. 1 are prepared by assuming a case where two kinds of gas types are used in a gas treatment step of a process recipe.

In a step S1 (first step), the control unit B12 selects a M1-th (M1 is a natural number satisfying a relationship of 1≤M1≤M−1) branch pipeline A3 and a M2-th (M2 is a natural number satisfying relationships of 2≤M2≤M and M1<M2) branch pipeline A3 corresponding to two kinds of gas types among the plurality of branch pipelines A3, and a N1-th (N1 is a natural number satisfying a relationship of 1≤N1≤N−1) branch pipeline B3 and a N2-th (N2 is a natural number satisfying relationships of 2≤N2≤N and N1<N2) branch pipeline B3 corresponding to two kinds of gas types among the plurality of branch pipelines B3, based on the apparatus information stored in the memory.

After the step S1, in a step S2 (second step), the control unit B12 arranges the treatment process of the substrate treatment apparatus B10 performed using the process recipe, in accordance with a combination of the first pipe numbers M1 and M2 and values of set flow rates corresponding to the M1-th branch pipeline A3 and the M2-th branch pipeline A3 selected among the plurality of branch pipelines A3 in the step S1, and the second pipe numbers N1 and N2 and values of set flow rates corresponding to the N1-th branch pipeline B3 and the N2-th branch pipeline B3 selected among the plurality of branch pipelines B3 in the step S1, based on the apparatus information stored in the memory. The step S2 includes steps S21 to S29.

Accordingly, a difference between the configuration of the gas supply system A1 (configuration of the branch pipelines A3 and the like) and the configuration of the gas supply system B1 (configuration of the branch pipelines B3 and the like) is accurately specified in the first step, the treatment process of the substrate treatment apparatus B10 is arranged based on the difference specified in the first step, in the second step, and accordingly, the arrangement is accurately performed.

In a case where it is determined that, in the step S21 subsequent to the step S1, the plurality of second branch pipelines (branch pipelines B3) selected in the step S1 satisfy a relationship of "pipe number of the pipeline having a high flow rate">"pipe number of the pipeline having a low flow rate" (step S21: Yes), and it is determined that, in the step S22 subsequent to the step S21: Yes, the plurality of first branch pipelines (branch pipelines A3) selected in the step S1 do not satisfy a relationship of "pipe number of the pipeline having a high flow rate">"pipe number of the pipeline having a low flow rate" (step S22: No), the control unit B12 performs a treatment of the step S23 (first arrangement). That is, in a case where a value of a set flow rate corresponding to the N2-th branch pipeline B3 is greater than a value of a set flow rate corresponding to the N1-th branch pipeline B3 and a value of a set flow rate corresponding to the M1-th branch pipeline A3 is greater than a value of a set flow rate corresponding to the M2-th branch pipeline A3 (in a case of the step S21: Yes and the step S22: No), the control unit B12 performs a treatment of the step S23 (first arrangement).

In the first arrangement, the control unit B12 arranges the treatment process of the substrate treatment apparatus B10 performed using the process recipe, so that a time from a start time (T1) of the gas treatment step of the process recipe until a flow rate of a gas from the N1-th branch pipeline B3 flowing to the stem pipeline B4 reaches a set flow rate, is set as a time (TK1) necessary for a case where gas amount in the stem pipeline A4 is supplied at a set flow rate corresponding to the M2-th branch pipeline A3 when pressure is stable.

Figure 4:
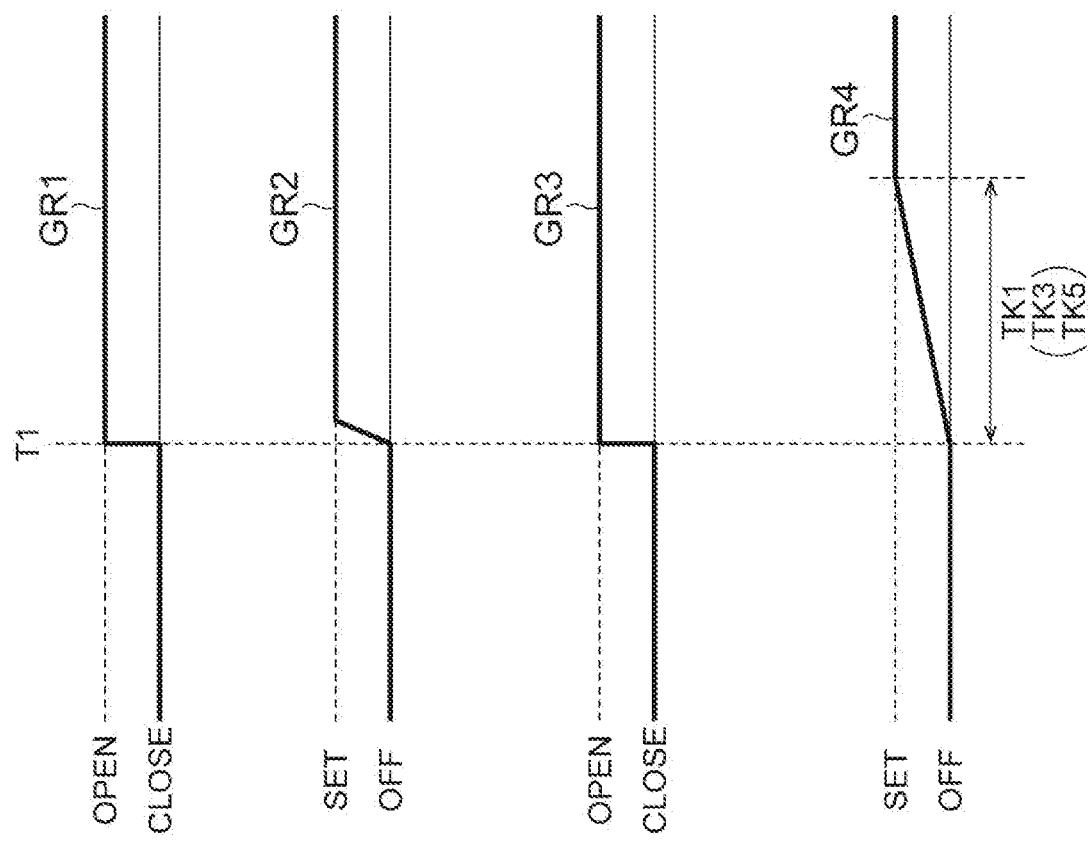
FIG. 4 is a view showing a content of each treatment regarding first arrangement, third arrangement, and fifth arrangement according to one exemplary embodiment with the elapse of time.

In a case where the first arrangement is not performed, when the total valves (valves B32, B33, and B51) of the gas supply system B1 transition from the state of CLOSE to the state of OPEN, and the flow rate controller B31 provided on the N1-th branch pipeline B3 controls a flow rate of a gas flowing from the N1-th branch pipeline B3 to the stem pipeline B4 to become a set flow rate, at the start time (T1) of the gas treatment step of the process recipe, as shown in a graph GR1 of FIG. 4, the flow rate of the gas flowing from the N1-th branch pipeline B3 to the stem pipeline B4 rapidly reaches a set flow rate, as shown in a graph GR2 of FIG. 4.

With respect to this, in a case where the first arrangement is performed, when the total valves (valves B32, B33, and B51) of the gas supply system B1 transition from the state of CLOSE to the state of OPEN, at the start time (T1) of the gas treatment step of the process recipe, as shown in a graph GR3 of FIG. 4, the flow rate controller B31 provided on the N1-th branch pipeline B3 controls the flow rate of the gas flowing from the N1-th branch pipeline B3 to the stem pipeline B4 to be gradually increased and the flow rate of the gas flowing from the N1-th branch pipeline B3 to the stem pipeline B4 to become a set flow rate of the N1-th branch pipeline B3, when the time TK1 has elapsed, as shown in a graph GR4 of FIG. 4.

Accordingly, in a case where the supply of the gas from the gas supply system A1 to the treatment vessel A6 is delayed, compared to the supply of the gas from the gas supply system B1 to the treatment vessel B6 due to a difference in the pipe numbers of the branch pipelines (difference in position of the branch pipelines with respect to the main pipeline) and a difference in values of set flow rates, a set flow rate of the gas supply system B1 is controlled in accordance with the delay occurred on the substrate treatment apparatus A10 side, and thus, the treatment process of the substrate treatment apparatus B10 performed using the process recipe for the substrate treatment apparatus A10 may conform to the treatment process of the substrate treatment apparatus A10.

A method for calculating the TK1 will be described. The method will be described using the branch pipelines selected in the step S1 as an example. First, the following definitions are made.

A value of pressure of a joint between the M2-th branch pipeline A3 and the stem pipeline A4 when pressure is stable is set as P11 [Pa].

A value of pressure of a joint between the M1-th branch pipeline A3 and the stem pipeline A4 when pressure is stable is set as P12 [Pa].

A value of a set main flow rate of the main pipeline A5 is set as QP1 [Pa·m³/sec].

A value of a coefficient of viscosity of a gas flowing through the main pipeline A5 is set as ηP1 [Pa·sec].

A value of a set flow rate of the M2-th branch pipeline A3 is set as QS1 [Pa·m³/sec].

A value of a coefficient of viscosity of a gas type corresponding to the M2-th branch pipeline A3 is set as ηS1 [Pa·sec].

A length from a joint between the stem pipeline A4 and the M1-th branch pipeline A3 to the treatment vessel A6 is set as LP1 [m].

A diameter of a cross section of the main pipeline A5 is set as RP1 [m].

A length of the stem pipeline A4 from a joint between the M2-th branch pipeline A3 and the stem pipeline A4 to a joint between the M1-th branch pipeline A3 and the stem pipeline A4 is set as LS1 [m].

A diameter of a cross section of the stem pipeline A4 is set as RS1 [m].

A value of gas amount in the stem pipeline A4 from the joint between the M2-th branch pipeline A3 and the stem pipeline A4 to the joint between the M1-th branch pipeline A3 and the stem pipeline A4, when pressure is stable, is set as S11 [Pa·m³].

A value of gas amount in a region of the stem pipeline A4 excluding a region from the joint between the M2-th branch pipeline A3 and the stem pipeline A4 to a joint between the first branch pipeline A3 and the stem pipeline A4, when pressure is stable, is set as S12 [Pa·m³].

A value of a volume except for a volume of flow path relating to the M2-th branch pipeline A3 (value obtained by excluding a volume of a portion between the joint between the M2-th branch pipeline A3 and the stem pipeline A4 and the joint between the first branch pipeline A3 the stem pipeline A4 from a volume of the stem pipeline A4) is set as V1.

The following expressions are satisfied. In all of the expressions shown in the exemplary embodiment, in a case where a symbol "^" is included, A^2, for example, represents the square of A and A^(3/2) represents A to the power of 3/2. In all of the expressions shown below, in a case where a symbol "π" is include, π represents the ratio of the circumference of a circle to its diameter. Expressions 11 and 12 below and Expressions 21 and 22 which will be described later are based on the Hagen-Poiseuille flow (Hagen-Poiseuille equation).

$$P12\hat{}2 = (16 \times QP1 \times \eta P1 \times LP1)/(\pi \times RP1\hat{}4) \quad \text{(Expression 11)}$$

$$P11\hat{}2 = P12\hat{}2 + (16 \times QS1 \times \eta S1 \times LS1)/(\pi \times RS1\hat{}4) \quad \text{(Expression 12)}$$

$$S11 = ((16 \times QS1 \times \eta S1 \times \pi \times LS1 + P12\hat{}2 \times \pi\hat{}2 \times RS1\hat{}4)\hat{}(3/2) - P12\hat{}3 \times \pi\hat{}3 \times RS1\hat{}6)/(24 \times QS1 \times \eta S1 \times \pi) \quad \text{(Expression 13)}$$

$$S12 = P11 \times V1 \quad \text{(Expression 14)}$$

$$TK1 = (S11 + S12)/QS1 \quad \text{(Expression 15)}$$

In a case where it is determined that, in the step S21 subsequent to the step S1, the second branch pipelines (branch pipelines B3) selected in the step S1 do not satisfy a relationship of "pipe number of the pipeline having a high flow rate">"pipe number of the pipeline having a low flow rate" (step S21: No), and it is determined that, in the step S24 subsequent to the step S21: No, the first branch pipelines (branch pipelines A3) selected in the step S1 satisfy a relationship of "pipe number of the pipeline having a high flow rate">"pipe number of the pipeline having a low flow rate" (step S24: Yes), the control unit B12 performs a treatment of the step S25 (second arrangement). That is, in a case where a value of a set flow rate corresponding to the N1-th branch pipeline B3 is greater than a value of a set flow rate corresponding to the N2-th branch pipeline B3 and a value of a set flow rate corresponding to the M2-th branch pipeline A3 is greater than a value of a set flow rate corresponding to the M1-th branch pipeline A3 (in a case of the step S21: No and the step S24: Yes), the control unit B12 performs a treatment of the step S25 (second arrangement).

In a first aspect of the second arrangement, the treatment process of the substrate treatment apparatus B10 performed using the process recipe is arranged so that the flow rate of the gas flowing from the N2-th branch pipeline B3 becomes a value of a maximum flow rate of the gas flowing from the N2-th branch pipeline B3 to the stem pipeline B4, during the time from the start time (T1) of the gas treatment step of the process recipe until a time (TK21) necessary for a case where gas amount in the stem pipeline B4 is supplied at a difference flow rate obtained by subtracting a value of a set flow rate corresponding to the N2-th branch pipeline B3 from a value of a maximum flow rate of the gas flowing from the N2-th branch pipeline B3 to the stem pipeline B4, when pressure is stable, has elapsed.

Figure 5:
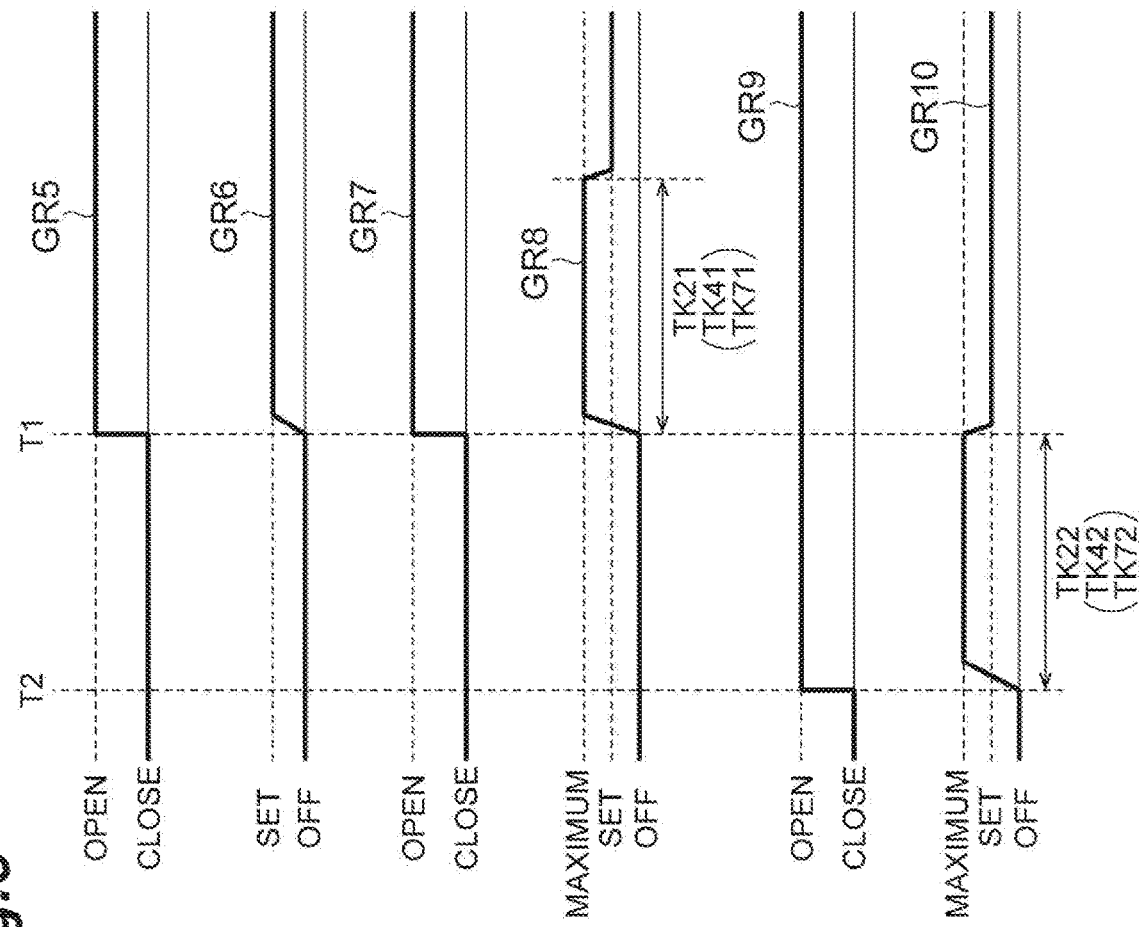
FIG. 5 is a view showing a content of each treatment regarding second arrangement, fourth arrangement, and seventh arrangement according to one exemplary embodiment with the elapse of time.

In a case where the first aspect of the second arrangement is not performed, when the total valves (valves B32, B33, and B51) of the gas supply system B1 transition from the state of CLOSE to the state of OPEN, and the flow rate controller B31 provided on the N2-th branch pipeline B3 controls a flow rate of a gas flowing from the N2-th branch pipeline B3 to the stem pipeline B4 to become a set flow rate, at the start time (T1) of the gas treatment step of the process recipe, as shown in a graph GR5 of FIG. 5, the flow rate of the gas flowing from the N2-th branch pipeline B3 to the stem pipeline B4 rapidly reaches a set flow rate, as shown in a graph GR6 of FIG. 5.

With respect to this, in a case where the first aspect of the second arrangement is performed, when the total valves (valves B32, B33, and B51) of the gas supply system B1 transition from the state of CLOSE to the state of OPEN, at the start time (T1) of the gas treatment step of the process recipe, as shown in a graph GR7 of FIG. 5, the flow rate controller B31 provided on the N2-th branch pipeline B3 controls the flow rate of the gas flowing from the N2-th branch pipeline B3 to the stem pipeline B4 to become a maximum flow rate of the N2-th branch pipeline B3 until the time TK21 has elapsed, and controls the flow rate of the gas flowing from the N2-th branch pipeline B3 to the stem pipeline B4 to become a set flow rate of the N2-th branch pipeline B3, when the time TK21 has elapsed, as shown in a graph GR8 of FIG. 5.

As described above, in a case where the supply of the gas from the gas supply system B1 to the treatment vessel B6 is delayed, compared to the supply of the gas from the gas supply system A1 to the treatment vessel A6 due to a difference in position of the branch pipelines (difference in position of the branch pipelines with respect to the main pipeline) and a difference in values of set flow rates, the flow rate of the gas of the gas supply system B1 is controlled to increase to be higher than the setting from a start time of the gas treatment step to compensate the delay on the substrate treatment apparatus B10 side, and thus, the treatment process of the substrate treatment apparatus B10 performed using the process recipe for the substrate treatment apparatus A10 may conform to the treatment process of the substrate treatment apparatus A10.

In a second aspect of the second arrangement, the treatment process of the substrate treatment apparatus B10 performed using the process recipe is arranged so that the flow rate of the gas flowing from the N2-th branch pipeline B3 becomes a value of a maximum flow rate of the gas flowing from the N2-th branch pipeline B3 to the stem pipeline B4, during the time from a non-start time (T2) of the gas treatment step of the process recipe until a time (TK22) necessary for a case where gas amount in the stem pipeline B4 is supplied at a maximum flow rate of the gas flowing from the N2-th branch pipeline B3 to the stem pipeline B4, when pressure is stable, has elapsed and the gas treatment step is started (time from T2 to T1).

In a case where the second aspect of the second arrangement is performed, when the total valves (valves B32, B33, and B51) of the gas supply system B1 transition from the state of CLOSE to the state of OPEN, at the non-start time (T2) of the gas treatment step of the process recipe, as shown in a graph GR9 of FIG. 5, the flow rate controller B31 provided on the N2-th branch pipeline B3 controls the flow rate of the gas flowing from the N2-th branch pipeline B3 to the stem pipeline B4 to become a maximum flow rate of the N2-th branch pipeline B3 until the time reaches the start time (T1) of the gas treatment step (during the time TK22), and controls the flow rate of the gas flowing from the N2-th branch pipeline B3 to the stem pipeline B4 to become a set flow rate of the N2-th branch pipeline B3, from the start time (T1) of the gas treatment step, as shown in a graph GR10 of FIG. 5.

Accordingly, in a case where the supply of the gas from the gas supply system B1 to the treatment vessel B6 is delayed, compared to the supply of the gas from the gas supply system A1 to the treatment vessel A6 due to a difference in the pipe numbers of the branch pipelines (difference in position of the branch pipelines with respect to the main pipeline) and a difference in values of set flow rates, the controlling is performed so that the gas supply of the gas supply system B1 is started at a non-start time of the gas treatment step to compensate the delay on the substrate treatment apparatus B10 side until a start time of the gas treatment step, and thus, the treatment process of the substrate treatment apparatus B10 performed using the process recipe for the substrate treatment apparatus A10 may conform to the treatment process of the substrate treatment apparatus A10.

A method for calculating the TK21 and TK22 will be described. The method will be described using the branch pipelines selected in the step S1 as an example. First, the following definitions are made.

A value of pressure of a joint between the N2-th branch pipeline B3 and the stem pipeline B4 when pressure is stable is set as P21 [Pa].

A value of pressure of a joint between the N1-th branch pipeline B3 and the stem pipeline B4 when pressure is stable is set as P22 [Pa].

A value of a set main flow rate of the main pipeline B5 is set as QP2 [Pa·m$^3$/sec].

A value of a coefficient of viscosity of a gas flowing through the main pipeline B5 is set as ηP2 [Pa·sec].

A value of a set flow rate of the N2-th branch pipeline B3 is set as QS2 [Pa·m$^3$/sec].

A value of a coefficient of viscosity of a gas type corresponding to the N2-th branch pipeline B3 is set as S2 [Pa·sec].

A length from a joint between the stem pipeline B4 and the N1-th branch pipeline B3 to the treatment vessel B6 is set as LP2 [m].

A diameter of a cross section of the main pipeline B5 is set as RP2 [m].

A length of the stem pipeline B4 from a joint between the N2-th branch pipeline B3 and the stem pipeline B4 to a joint between the N1-th branch pipeline B3 and the stem pipeline B4 is set as LS2 [m].

A diameter of a cross section of the stem pipeline B4 is set as RS2 [m]

A value of gas amount in the stem pipeline B4 from the joint between the N2-th branch pipeline B3 and the stem pipeline B4 to the joint between the N1-th branch pipeline B3 and the stem pipeline B4, when pressure is stable, is set as S21 [Pa·m$^3$].

A value of gas amount in a region of the stem pipeline B4 excluding a region from the joint between the N2-th branch pipeline B3 and the stem pipeline B4 to a joint between the first branch pipeline B3 and the stem pipeline B4, when pressure is stable, is set as S22 [Pa·m$^3$].

A value of a maximum flow rate of the N2-th branch pipeline B3 is set as QS2max [Pa·m$^3$/sec].

A value of a volume except for a volume of flow path relating to the N2-th branch pipeline B3 (value obtained by excluding a volume of a portion between the joint between the N2-th branch pipeline B3 and the stem pipeline B4 and the joint between the first branch pipeline B3 the stem pipeline B4 from a volume of the stem pipeline B4) is set as V2.

The following expressions are satisfied.

$$P22^2=(16 \times QP2 \times \eta P2 \times LP2)/(\pi \times RP2^4) \quad \text{(Expression 21)}$$

$$P21^2=P22^2+(16 \times QS2 \times \eta S2 \times LS2)/(\pi \times RS2^4) \quad \text{(Expression 22)}$$

$$S21=((16 \times QS2 \times \eta S2 \times \pi \times LS2+P22^2 \times \pi \times RS2^4)^{(3/2)}-P22^3 \times \pi^3 \times RS2^6)/(24 \times QS2 \times \eta S2 \times \pi) \quad \text{(Expression 23)}$$

$$S22=P21 \times V2 \quad \text{(Expression 24)}$$

$$TK21=(S21+S22)/(QS2\text{max}-QS2) \quad \text{(Expression 25)}$$

$$TK22=(S21+S22)/QS2\text{max} \quad \text{(Expression 26)}$$

In a case where it is determined that, in the step S26 subsequent to the step S24: No, the first branch pipelines (branch pipelines A3) and the second branch pipelines (branch pipelines B3) selected in the step S1 do not satisfy a relationship of M2 (the first pipe number of the M2-th branch pipeline A3)=N2 (the second pipe number of the N2-th branch pipeline B3) (step S26: No), and it is determined that, in the step S27 subsequent to the step S26: No, the first branch pipelines (branch pipelines A3) and the second branch pipelines (branch pipelines B3) selected in the step S1 satisfy a relationship of M2 (the first pipe number of the M2-th branch pipeline A3)>N2 (the second pipe number of the N2-th branch pipeline B3) (step S27: Yes), the control unit B12 performs the step S28 (third arrangement). That is, in a case where a value of a set flow rate corresponding to the M1-th branch pipeline A3 is greater than a value of a set flow rate corresponding to the M2-th branch pipeline A3, a value of a set flow rate corresponding to the N1-th branch pipeline B3 is greater than a value of a set flow rate corresponding to the N2-th branch pipeline B3, and M2 is greater than N2 (in a case of the step S21: No, the step S24: No, the step S26: No, and the step S27: Yes), the control unit B12 performs the step S28 (third arrangement).

In the third arrangement, a difference gas amount obtained by subtracting gas amount in the stem pipeline B4, when pressure is stable, from gas amount in the stem pipeline A4, when pressure is stable, is calculated, and the treatment process of the substrate treatment apparatus B10 performed using the process recipe is arranged, so that the time from the start time (T1) of the gas treatment step of the process recipe until a flow rate of a gas from the N2-th branch pipeline B3 flowing to the stem pipeline B4 reaches a set flow rate, is set as a time (TK3) necessary for a case where the difference gas amount is supplied at a set flow rate corresponding to the M2-th branch pipeline A3.

In a case where the third arrangement is not performed, when the total valves (valves B32, B33, and B51) of the gas supply system B1 transition from the state of CLOSE to the state of OPEN, and the flow rate controller B31 provided on the N2-th branch pipeline B3 controls a flow rate of a gas flowing from the N2-th branch pipeline B3 to the stem pipeline B4 to become a set flow rate, at the start time (T1) of the gas treatment step of the process recipe, as shown in the graph GR1 of FIG. 4, the flow rate of the gas flowing from the N2-th branch pipeline B3 to the stem pipeline B4 rapidly reaches a set flow rate, as shown in the graph GR2 of FIG. 4.

With respect to this, in a case where the third arrangement is performed, when the total valves (valves B32, B33, and B51) of the gas supply system B1 transition from the state of CLOSE to the state of OPEN, at the start time (T1) of the gas treatment step of the process recipe, as shown in the graph GR3 of FIG. 4, the flow rate controller B31 provided on the N2-th branch pipeline B3 controls the flow rate of the gas flowing from the N2-th branch pipeline B3 to the stem pipeline B4 to be gradually increased and the flow rate of the gas flowing from the N2-th branch pipeline B3 to the stem pipeline B4 to become a set flow rate of the N2-th branch pipeline B3, when the time TK3 has elapsed, as shown in the graph GR4 of FIG. 4.

Accordingly, in a case where the supply of the gas from the gas supply system A1 to the treatment vessel A6 is delayed, compared to the supply of the gas from the gas supply system B1 to the treatment vessel B6 due to a difference in the pipe numbers of the branch pipelines (difference in position of the branch pipelines with respect to the main pipeline) and a difference in values of set flow rates, a set flow rate of the gas supply system B1 is controlled in accordance with the delay occurred on the substrate treatment apparatus A10 side, and thus, the treatment process of the substrate treatment apparatus B10 performed using the process recipe for the substrate treatment apparatus A10 may conform to the treatment process of the substrate treatment apparatus A10.

A method for calculating the TK3 will be described. The method will be described using the branch pipelines selected in the step S1 as an example. First, the following definitions are made.

A value of a set flow rate of the M2-th branch pipeline A3 is set as QS3A [Pa·m³/sec].

A value of gas amount in the stem pipeline A4 from the joint between the M2-th branch pipeline A3 and the stem pipeline A4 to the joint between the M1-th branch pipeline A3 and the stem pipeline A4, when pressure is stable, is set as S3A1 [Pa·m³].

A value of gas amount in a region of the stem pipeline A4 excluding a region from the joint between the M2-th branch pipeline A3 and the stem pipeline A4 to a joint between the first branch pipeline A3 and the stem pipeline A4, when pressure is stable, is set as S3A2 [Pa·m³].

A value of gas amount in the stem pipeline B4 from the joint between the N2-th branch pipeline B3 and the stem pipeline B4 to the joint between the N1-th branch pipeline B3 and the stem pipeline B4, when pressure is stable, is set as S3B1 [Pa·m³].

A value of gas amount in a region of the stem pipeline B4 excluding a region from the joint between the N2-th branch pipeline B3 and the stem pipeline B4 to a joint between the first branch pipeline B3 and the stem pipeline B4, when pressure is stable, is set as S3B2 [Pa·m³].

The following expression is satisfied.

$$((S3A1+S3A2)-(S3B1+S3B2))/QS3A \quad \text{(Expression 31)}$$

Since S3A1 [Pa·m³] corresponds to S11 [Pa·m³] of Expression 13 and S3A2 [Pa·m³] corresponds to S12 [Pa·m³] of Expression 14, S3A1 [Pa·m³] and S3A2 [Pa·m³] are calculated in the same manner as in Expressions 11 to 14. Since S3B1 [Pa·m³] corresponds to S21 [Pa·m³] of Expression 23 and S3B2 [Pa·m³] corresponds to S22 [Pa·m³] of Expression 24, S3B1 [Pa·m³] and S3B2 [Pa·m³] are calculated in the same manner as in Expressions 21 to 24.

In a case where it is determined that, in the step S26 subsequent to the step S24: No, the first branch pipelines (branch pipelines A3) and the second branch pipelines (branch pipelines B3) selected in the step S1 do not satisfy a relationship of M2 (the first pipe number of the M2-th branch pipeline A3)=N2 (the second pipe number of the N2-th branch pipeline B3) (step S26: No), and it is determined that, in the step S27 subsequent to the step S26: No, the first branch pipelines (branch pipelines A3) and the second branch pipelines (branch pipelines B3) selected in the step S1 do not satisfy a relationship of M2 (the first pipe number of the M2-th branch pipeline A3)>N2 (the second pipe number of the N2-th branch pipeline B3) (step S27: No), the control unit B12 performs the step S29 (fourth arrangement). That is, in a case where a value of a set flow rate corresponding to the M1-th branch pipeline A3 is greater than a value of a set flow rate corresponding to the M2-th branch pipeline A3, a value of a set flow rate corresponding to the N1-th branch pipeline B3 is greater than a value of a set flow rate corresponding to the N2-th branch pipeline B3, and N2 is greater than M2 (in a case of the step S21: No, the step S24: No, the step S26: No, and the step S27: No), the control unit B12 performs the step S29 (fourth arrangement).

In a first aspect of the fourth arrangement, a difference gas amount obtained by subtracting gas amount in the stem pipeline A4, when pressure is stable, from gas amount in the stem pipeline B4, when pressure is stable, is calculated, and the treatment process of the substrate treatment apparatus B10 performed using the process recipe is arranged, so that the flow rate of the gas flowing from the N2-th branch pipeline B3 becomes a value of a maximum flow rate of the gas flowing from the N2-th branch pipeline B3 to the stem pipeline B4, during the time from the start time (T1) of the gas treatment step of the process recipe until a time (TK41) necessary for a case where the difference gas amount is supplied at a difference flow rate obtained by subtracting a value of a set flow rate corresponding to the N2-th branch pipeline B3 from a value of a maximum flow rate of the gas flowing from the N2-th branch pipeline B3 to the stem pipeline B4 has elapsed.

In a case where the first aspect of the fourth arrangement is not performed, when the total valves (valves B32, B33, and B51) of the gas supply system B1 transition from the state of CLOSE to the state of OPEN, and the flow rate controller B31 provided on the N2-th branch pipeline B3 controls a flow rate of a gas flowing from the N2-th branch pipeline B3 to the stem pipeline B4 to become a set flow rate, at the start time (T1) of the gas treatment step of the process recipe, as shown in the graph GR5 of FIG. 5, the flow rate of the gas flowing from the N2-th branch pipeline B3 to the stem pipeline B4 rapidly reaches a set flow rate, as shown in the graph GR6 of FIG. 5.

With respect to this, in a case where the first aspect of the fourth arrangement is performed, when the total valves (valves B32, B33, and B51) of the gas supply system B1 transition from the state of CLOSE to the state of OPEN, at the start time (T1) of the gas treatment step of the process recipe, as shown in the graph GR7 of FIG. 5, the flow rate controller B31 provided on the N2-th branch pipeline B3 controls the flow rate of the gas flowing from the N2-th branch pipeline B3 to the stem pipeline B4 to become a maximum flow rate of the N2-th branch pipeline B3 until the time TK41 has elapsed, and controls the flow rate of the gas flowing from the N2-th branch pipeline B3 to the stem pipeline B4 to become a set flow rate of the N2-th branch pipeline B3, when the time TK41 has elapsed, as shown in the graph GR8 of FIG. 5.

As described above, in a case where the supply of the gas from the gas supply system B1 to the treatment vessel B6 is delayed, compared to the supply of the gas from the gas supply system A1 to the treatment vessel A6 due to a difference in the pipe numbers of the branch pipelines (difference in position of the branch pipelines with respect to the main pipeline) and a difference in values of set flow rates, the flow rate of the gas of the gas supply system B1 is controlled to increase to be higher than the setting from a start time of the gas treatment step to compensate the delay on the substrate treatment apparatus B10 side, and thus, the treatment process of the substrate treatment apparatus B10 performed using the process recipe for the substrate treatment apparatus A10 may conform to the treatment process of the substrate treatment apparatus A10.

In a second aspect of the fourth arrangement, a difference gas amount obtained by subtracting gas amount in the stem pipeline A4, when pressure is stable, from gas amount in the stem pipeline B4, when pressure is stable, is calculated, and the treatment process of the substrate treatment apparatus B10 performed using the process recipe is arranged so that the flow rate of the gas flowing from the N2-th branch pipeline B3 becomes a value of a maximum flow rate of the gas flowing from the N2-th branch pipeline B3 to the stem pipeline B4, during the time from a non-start time of the gas treatment step of the process recipe until a time (TK42) necessary for a case where the difference gas amount is supplied at a maximum flow rate of the gas flowing from the N2-th branch pipeline B3 to the stem pipeline B4 has elapsed and the gas treatment step is started (time from T2 to T1).

In a case where the second aspect of the fourth arrangement is performed, when the total valves (valves B32, B33, and B51) of the gas supply system B1 transition from the state of CLOSE to the state of OPEN, at the non-start time (T2) of the gas treatment step of the process recipe, as shown in the graph GR9 of FIG. 5, the flow rate controller B31 provided on the N2-th branch pipeline B3 controls the flow rate of the gas flowing from the N2-th branch pipeline B3 to the stem pipeline B4 to become a maximum flow rate of the N2-th branch pipeline B3 until the time reaches the start time (T1) of the gas treatment step (during the time TK42), and controls the flow rate of the gas flowing from the N2-th branch pipeline B3 to the stem pipeline B4 to become a set flow rate of the N2-th branch pipeline B3, from the start time (T1) of the gas treatment step, as shown in the graph GR10 of FIG. 5.

Accordingly, in a case where the supply of the gas from the gas supply system B1 to the treatment vessel B6 is delayed, compared to the supply of the gas from the gas supply system A1 to the treatment vessel A6 due to a difference in the pipe numbers of the branch pipelines (difference in position of the branch pipelines with respect to the main pipeline) and a difference in values of set flow rates, the controlling is performed so that the gas supply of the gas supply system B1 is started at a non-start time of the gas treatment step to compensate the delay on the substrate treatment apparatus B10 side until a start time of the gas treatment step, and thus, the treatment process of the substrate treatment apparatus B10 performed using the process recipe for the substrate treatment apparatus A10 may conform to the treatment process of the substrate treatment apparatus A10.

A method for calculating the TK41 and TK 42 will be described. The method will be described using the branch pipelines selected in the step S1 as an example. First, the following definitions are made.

A value of gas amount in the stem pipeline A4 from the joint between the M2-th branch pipeline A3 and the stem pipeline A4 to the joint between the M1-th branch pipeline A3 and the stem pipeline A4, when pressure is stable, is set as S4A1 [Pa·m$^3$].

A value of gas amount in a region of the stem pipeline A4 excluding a region from the joint between the M2-th branch pipeline A3 and the stem pipeline A4 to a joint between the first branch pipeline A3 and the stem pipeline A4, when pressure is stable, is set as S4A2 [Pa·m$^3$].

A value of a set flow rate of the N2-th branch pipeline B3 is set as QS4B [Pa·m$^3$/sec].

A value of a maximum flow rate of the N2-th branch pipeline B3 is set as QS4Bmax [Pa·m$^3$/sec].

A value of gas amount in the stem pipeline B4 from the joint between the N2-th branch pipeline B3 and the stem pipeline B4 to the joint between the N1-th branch pipeline B3 and the stem pipeline B4, when pressure is stable, is set as S4B1 [Pa·m$^3$].

A value of gas amount in a region of the stem pipeline B4 excluding a region from the joint between the N2-th branch pipeline B3 and the stem pipeline B4 to a joint between the first branch pipeline B3 and the stem pipeline B4, when pressure is stable, is set as S4B2 [Pa·m$^3$].

The following expression is satisfied.

$$TK41=((S4B1+S4B2)-(S4A1+S4A2))/(QS4B\text{max}-QS4B) \quad \text{(Expression 41)}$$

$$TK42=((S4B1+S4B2)-(S3A1+S4A2))/QS4B\text{max} \quad \text{(Expression 42)}$$

Since S4A1 [Pa·m$^3$] corresponds to S11 [Pa·m$^3$] of Expression 13 and S4A2 [Pa·m$^3$] corresponds to S12 [Pa·m$^3$] of Expression 14, S4A1 [Pa·m$^3$] and S4A2 [Pa·m$^3$] are calculated in the same manner as in Expressions 11 to 14. Since S4B1 [Pa·m$^3$] corresponds to S21 [Pa·m$^3$] of Expression 23 and S4B2 [Pa·m$^3$] corresponds to S22 [Pa·m$^3$] of Expression 24, S4B1 [Pa·m$^3$] and S4B2 [Pa·m$^3$] are calculated in the same manner as in Expressions 21 to 24.

Next, the method MT will be described along the flowchart shown in FIG. 2. The treatments shown in the flowchart of FIG. 2 are performed by controlling the N flow rate controllers B31, the N valves B32, the N valves B33, the valve B51, the pressure regulating valve B71, and the exhaust device B8 by the control unit B12. In steps S3 to S5, the control unit B12 determines a difference between volume of the main pipeline A5 and volume of the main pipeline B5 based on the apparatus information stored in the memory, and arranges the treatment process of the main pipeline B5 performed using the process recipe based on the determined result.

Accordingly, since a speed of a supply of a gas from a gas supply system to a treatment vessel changes depending on volume of main pipelines directly connected to the treatment vessels, the treatment process of the substrate treatment apparatus B10 performed using the process recipe for the substrate treatment apparatus A10 is arranged based on the determined result of a difference between volume of the main pipeline A5 and volume of the main pipeline B5, and thus, the treatment process of the substrate treatment apparatus B10 performed using the process recipe for the substrate treatment apparatus A10 may conform to the treatment process of the substrate treatment apparatus A10.

In a case where it is determined that, in the step S3, a relationship of "volume of the first main pipeline (main pipeline A5)">"volume of the second main pipeline (main pipeline B5)" is satisfied (step S3: Yes), the control unit B12 performs the step S4 (fifth arrangement or sixth arrangement). That is, in a case where volume of the main pipeline A5 is greater than volume of the main pipeline B5, the control unit B12 performs the step S4 (fifth arrangement or sixth arrangement).

In the fifth arrangement, a difference main gas amount obtained by subtracting main gas amount in the main pipeline B5, when pressure is stable, from main gas amount in the main pipeline A5, when pressure is stable, is calculated, and the treatment process of the substrate treatment apparatus B10 performed using the process recipe is arranged, so that the time from the start time (T1) of the gas treatment step of the process recipe until a main flow rate of a gas flowing through the main pipeline B5 reaches a set main flow rate corresponding to the main pipeline B5, is set as a time (TK5) necessary for a case where the difference main gas amount is supplied at a set main flow rate corresponding to the main pipeline A5.

In a case where the fifth arrangement is not performed, when the total valves (valves B32, B33, and B51) of the gas supply system B1 transition from the state of CLOSE to the state of OPEN, and the flow rate controller B31 corresponding to the gas type used in the gas treatment step of the process recipe controls a main flow rate of a gas flowing through the main pipeline B5 to become a set main flow rate, at the start time (T1) of the gas treatment step of the process recipe, as shown in the graph GR1 of FIG. 4, a main flow rate of the gas flowing through the main pipeline B5 rapidly reaches a set main flow rate, as shown in the graph GR2 of FIG. 4.

With respect to this, in a case where the fifth arrangement is performed, when the total valves (valves B32, B33, and B51) of the gas supply system B1 transition from the state of CLOSE to the state of OPEN, at the start time (T1) of the gas treatment step of the process recipe, as shown in a graph GR3 of FIG. 4, the flow rate controller B31 corresponding to the gas type used in the gas treatment step of the process recipe controls the flow rate of the gas flowing through the main pipeline B5 to be gradually increased and the flow rate of the gas flowing through the main pipeline B5 to become a set main flow rate of the main pipeline B5, when the time TK5 has elapsed, as shown in the graph GR4 of FIG. 4.

Accordingly, in a case where the supply of the gas from the gas supply system A1 to the treatment vessel A6 is delayed, compared to the supply of the gas from the gas supply system B1 to the treatment vessel B6 due to a difference in volume of the main pipelines directly connected to the treatment vessels, a set flow rate of the gas supply system B1 is controlled in accordance with the delay occurred on the substrate treatment apparatus A10 side, and thus, the treatment process of the substrate treatment apparatus B10 performed using the process recipe for the substrate treatment apparatus A10 may conform to the treatment process of the substrate treatment apparatus A10.

A method for calculating the time TK5 will be described. First, the following definitions are made.

A value of a set main flow rate of the main pipeline A5 is set as QP5A [Pa·m³/sec].

A value of a coefficient of viscosity of a gas flowing through the main pipeline A5 is set as ηP5A [Pa·sec].

A length of the main pipeline A5 is set as LP5A [m].

A value of gas amount in the main pipeline A5, when pressure is stable, is set as S5A [Pa·m³].

A value of a set main flow rate of the main pipeline B5 is set as QP5B [Pa·m³/sec].

A value of a coefficient of viscosity of a gas flowing through the main pipeline B5 is set as ηP5B [Pa·sec].

A length of the main pipeline B5 is set as LP5B [m].

A value of gas amount in the main pipeline B5, when pressure is stable, is set as S5B [Pa·m³].

The following expressions are satisfied.

$$S5A=(8\times(QP5A\times\eta P5A\times\pi\times LP5A^{\wedge}3)^{\wedge}(\tfrac{1}{2}))/3 \qquad \text{(Expression 51)}$$

$$S5B=(8\times(QP5B\times\eta P5B\times\pi\times LP5B^{\wedge}3)^{\wedge}(\tfrac{1}{2}))/3 \qquad \text{(Expression 52)}$$

$$TK5=(S5A-S5B)/QP5A \qquad \text{(Expression 53)}$$

In the sixth arrangement, in a case where a first attenuated main flow rate of a gas of the main pipeline A5 attenuated from a stop time of supply of the gas of the gas supply system A1 and a second attenuated main flow rate of a gas of the main pipeline B5 attenuated from a stop time of supply of the gas of the gas supply system B1 are compared to each other at a completion time of the gas treatment step of the process recipe, and the first attenuated main flow rate is higher than the second attenuated main flow rate, a difference attenuated main flow rate (Q(t) [Pa·m³/sec]) obtained by subtracting the second attenuated main flow rate from the first attenuated main flow rate is calculated, and the treatment process of the substrate treatment apparatus B10 performed using the process recipe is arranged, so that a gas of the gas supply system B1 at the difference attenuated main flow rate (Q(t) [Pa·m³/sec]) flows to the main pipeline B5 from a stop time of supply of the gas. (Q(t) [Pa·m³/sec]) is a function of t. t represents the time [sec].

Figure 6:
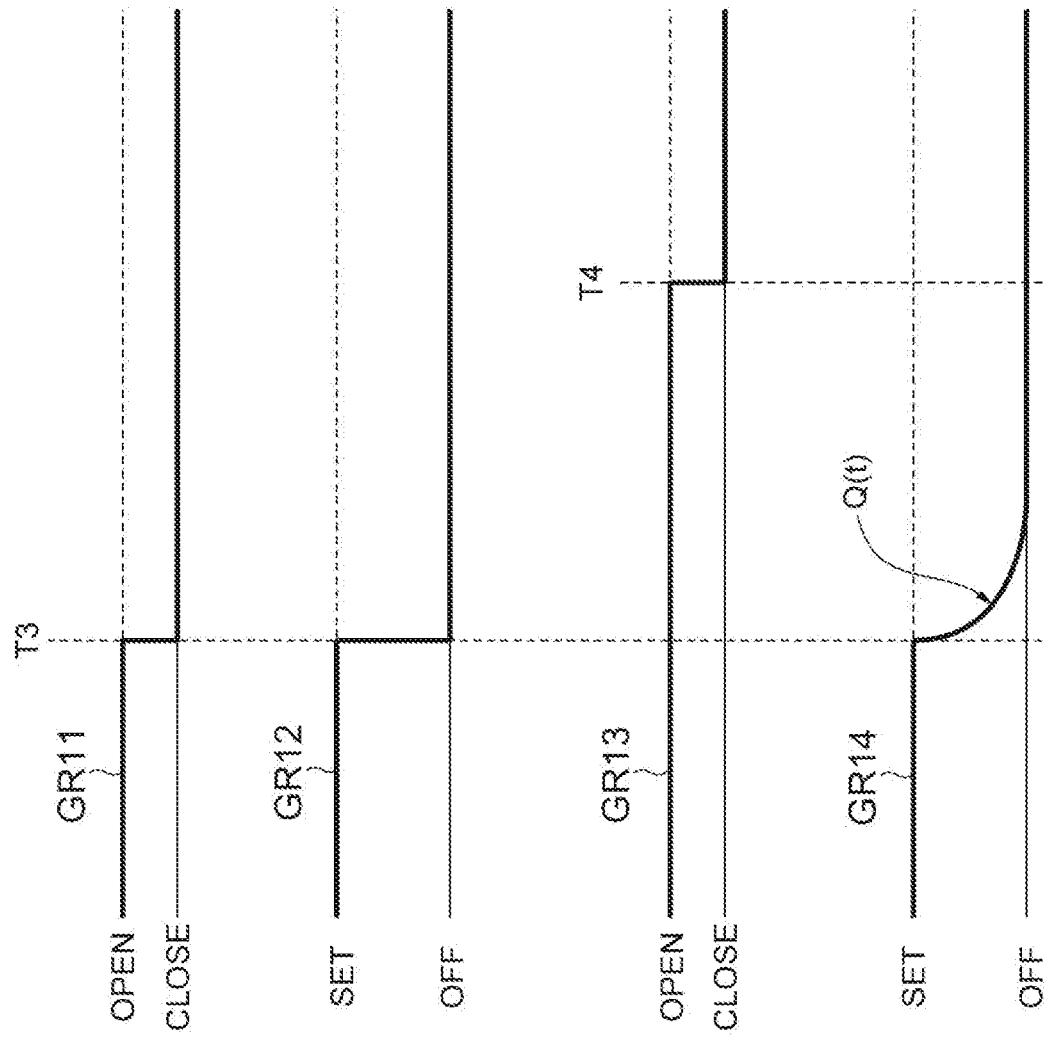
FIG. 6 is a view showing a content of a treatment regarding sixth arrangement according to one exemplary embodiment with the elapse of time.

In a case where the sixth arrangement is not performed, when the total valves (valves B32, B33, and B51) of the gas supply system B1 transition from the state of OPEN to the state of CLOSE, at a completion time (T3) of the gas treatment step of the process recipe, and the flow rate controller B31 corresponding to the gas type used in the gas treatment step of the process recipe stops the supply of the gas to the main pipeline B5 side, as shown in a graph GR11 of FIG. 6, a main flow rate of the gas flowing through the main pipeline B5 rapidly becomes similar to a substantial value of zero (for example, a value smaller than the detection error of gas amount), as shown in a graph GR12 of FIG. 6.

With respect to this, in a case where the sixth arrangement is performed, the total valves (valves B32, B33, and B51) of the gas supply system B1 transition from the state of OPEN to the state of CLOSE, at the time (T4) when a predetermined time has elapsed from a stop time (T3) of the gas treatment step of the process recipe, as shown in a graph GR13 of FIG. 6, and the flow rate controller B31 corresponding to the gas type used in the gas treatment step of the process recipe allows the gas of the gas type to flow at the difference attenuated main flow rate (Q(t) [Pa·m³/sec]) to the main pipeline B5 side, from the stop time (T3) of the gas treatment step. The time from the stop time T3 to the time T4 is a necessary time until the difference attenuated main flow rate becomes a substantial value of zero (for example, a value smaller than the detection error of gas amount).

As described above, in a case where the first attenuated main flow rate is higher than the second attenuated main flow rate, the gas supply system B1 is controlled so that the gas at the difference attenuated main flow rate (Q(t) [Pa·m³/sec]) obtained by subtracting the second attenuated main flow rate from the first attenuated main flow rate flows to the main pipeline B5, from a stop time of supply of the gas of the gas supply system B1, and thus, the treatment process of the substrate treatment apparatus B10 performed using the process recipe for the substrate treatment apparatus A10 may conform to the treatment process of the substrate treatment apparatus A10.

A method for calculating the difference attenuated main flow rate (Q(t) [Pa·m³/sec]) will be described.

A value (function of time t) of the attenuated main flow rate of the gas of the main pipeline A5 attenuated after the stop of the gas supply is set as QA(t) [Pa·m³/sec].
A value of a coefficient of viscosity of a gas flowing through the main pipeline A5 is set as ηP6A [Pa·sec].
A length of the main pipeline A5 is set as LP6A [m].
A value (function of time t) of the attenuated main flow rate of the gas of the main pipeline B5 attenuated after the stop of the gas supply is set as QB(t) [Pa·m³/sec].
A value of a coefficient of viscosity of a gas flowing through the main pipeline B5 is set as ηP6B [Pa·sec].
A length of the main pipeline B5 is set as LP6B [m].
t represents the elapsed time [sec] from the stop time T3 and t in QA(t) and QB(t) is defined as a value greater than 0 (for example, several msec).

The following expressions are satisfied.

$$QA(t)=(64\times\eta P6A\times\pi\times LP6A^3)/(9\times t^2) \quad \text{(Expression 61)}$$

$$QB(t)(64\times\eta P6B\times\pi\times LP6B^3)/(9\times t^2) \quad \text{(Expression 62)}$$

$$Q(t)=QA(t)-QB(t) \quad \text{(Expression 63)}$$

In a case where it is determined that, in the step S3, a relationship of "volume of the first main pipeline (main pipeline A5)">"volume of the second main pipeline (main pipeline B5)" is not satisfied (step S3: No), the control unit B12 performs the step S5 (seventh arrangement). That is, in a case where volume of the main pipeline B5 is greater than volume of the main pipeline A5, the control unit B12 performs the step S5 (seventh arrangement).

In a first aspect of the seventh arrangement, a difference main gas amount obtained by subtracting main gas amount in the main pipeline A5, when pressure is stable, from main gas amount in the main pipeline B5, when pressure is stable, is calculated, and the treatment process of the substrate treatment apparatus B10 performed using the process recipe is arranged, so that a main flow rate of the gas flowing through the main pipeline B5 becomes a value of a maximum main flow rate of the gas flowing to the main pipeline B5, during the time from a start time of the gas treatment step of the process recipe until a time (TK71) necessary for a case where the difference main gas amount is supplied at a difference main flow rate obtained by subtracting a value of a set main flow rate corresponding to the main pipeline B5 from a value of a maximum main flow rate of the gas flowing to the main pipeline B5 has elapsed.

In a case where the first aspect of the seventh arrangement is not performed, when the total valves (valves B32, B33, and B51) of the gas supply system B1 transition from the state of CLOSE to the state of OPEN, and the flow rate controller B31 corresponding to the gas type used in the gas treatment step of the process recipe controls a main flow rate of the main pipeline B5 to become a set main flow rate, at the start time (T1) of the gas treatment step of the process recipe, as shown in the graph GR5 of FIG. 5, a main flow rate of the gas flowing through the main pipeline B5 rapidly reaches a set main flow rate, as shown in the graph GR6 of FIG. 5.

With respect to this, in a case where the first aspect of the seventh arrangement is performed, when the total valves (valves B32, B33, and B51) of the gas supply system B1 transition from the state of CLOSE to the state of OPEN, at the start time (T1) of the gas treatment step of the process recipe, as shown in the graph GR7 of FIG. 5, the flow rate controller B31 corresponding to the gas type used in the gas treatment step of the process recipe controls a main flow rate of the gas flowing through the main pipeline B5 to become a maximum main flow rate of the main pipeline B5, until the time TK71 has elapsed, and controls a main flow rate of the gas flowing through the main pipeline B5 to become a set main flow rate of the main pipeline B5, when the time TK71 has elapsed, as shown in the graph GR8 of FIG. 5.

As described above, in a case where the supply of the gas from the gas supply system B1 to the treatment vessel B6 is delayed, compared to the supply of the gas from the gas supply system A1 to the treatment vessel A6 due to a difference in volume of the main pipelines directly connected to the treatment vessels, the flow rate of the gas of the gas supply system B1 is controlled to increase to be higher than the setting from a start time of the gas treatment step to compensate the delay on the substrate treatment apparatus B10 side, and thus, the treatment process of the substrate treatment apparatus B10 performed using the process recipe for the substrate treatment apparatus A10 may conform to the treatment process of the substrate treatment apparatus A10.

In a second aspect of the seventh arrangement, a difference main gas amount obtained by subtracting main gas amount in the main pipeline A5, when pressure is stable, from main gas amount in the main pipeline B5, when pressure is stable, is calculated, and the treatment process of the substrate treatment apparatus B10 performed using the process recipe is arranged so that a main flow rate of the gas flowing through the main pipeline B5 becomes a value of a maximum main flow rate of the gas flowing through the main pipeline B5, during the time from the non-start time (T2) of the gas treatment step of the process recipe until a time (TK72) necessary for a case where the difference main gas amount is supplied at a maximum main flow rate of the gas flowing through the main pipeline B5 has elapsed and the gas treatment step is started (time from T2 to T1).

In a case where the second aspect of the seventh arrangement is performed, when the total valves (valves B32, B33, and B51) of the gas supply system B1 transition from the state of CLOSE to the state of OPEN, at the non-start time (T2) of the gas treatment step of the process recipe, as shown in the graph GR9 of FIG. 5, the flow rate controller B31 corresponding to the gas type used in the gas treatment step of the process recipe controls a main flow rate of the gas flowing through the main pipeline B5 to become a maximum main flow rate of the main pipeline B5 until the time reaches the start time (T1) of the gas treatment step (during the time TK72), and controls a main flow rate of the gas flowing to the main pipeline B5 to become a set main flow rate of the main pipeline B5, from the start time (T1) of the gas treatment step, as shown in a graph GR10 of FIG. 5.

As described above, in a case where the supply of the gas from the gas supply system B1 to the treatment vessel B6 is delayed, compared to the supply of the gas from the gas supply system A1 to the treatment vessel A6 due to a difference in volume of the main pipelines directly connected to the treatment vessels, the controlling is performed so that the gas supply of the gas supply system B1 is started from a non-start time of the gas treatment step to compensate the delay on the substrate treatment apparatus B10 until a start time of the gas treatment step, and thus, the treatment process of the substrate treatment apparatus B10 performed using the process recipe for the substrate treatment apparatus A10 may conform to the treatment process of the substrate treatment apparatus A10.

A method for calculating the times TK71 and TK72 will be described. First, the following definitions are made.

A value of a set main flow rate of the main pipeline A5 is set as QP7A [Pa·m³/sec].
A value of a coefficient of viscosity of a gas flowing through the main pipeline A5 is set as ηP7A [Pa·sec].
A length of the main pipeline A5 is set as LP7A [m].
A value of gas amount in the main pipeline A5, when pressure is stable, is set as S7A [Pa·m³].
A value of a set main flow rate of the main pipeline B5 is set as QP7B [Pa·m³/sec].
A value of a maximum main flow rate of the main pipeline B5 is set as QP7Bmax [Pa·m³/sec].
A value of a coefficient of viscosity of a gas flowing through the main pipeline B5 is set as ηP7B [Pa·sec].
A length of the main pipeline B5 is set as LP7B [m].
A value of gas amount in the main pipeline B5, when pressure is stable, is set as S7B [Pa·m³].
The following expressions are satisfied.

$$S7A = (8 \times (QP7A \times \eta P7A \times \pi \times LP7A^3)^{(1/2)})/3 \quad \text{(Expression 71)}$$

$$S7B = (8 \times (QP7B \times \eta P7B \times \pi \times LP7B^3)^{(1/2)})/3 \quad \text{(Expression 72)}$$

$$TK71 = (S7B - S7A)/(QP7B\max - QP7B) \quad \text{(Expression 73)}$$

$$TK72 = (S7B - S7A)/QP7B\max \quad \text{(Expression 74)}$$

Although various exemplary embodiments have been described above, various modified aspect may be configured without being limited to the above-described exemplary embodiments. For example, in performing the method MT, an inductive coupling type plasma processing apparatus may be used without being limited to the plasma processing apparatus which uses microwaves as a plasma source.

From the foregoing description, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

For example, the treatment shown in the flowchart of FIG. 1 and the treatment shown in the flowchart of FIG. 2 can be performed in parallel (at the same time). In a case where both of the treatments are performed in parallel, the arrangement can be performed using the method described above, except for the fifth arrangement and the seventh arrangement. The fifth arrangement and the seventh arrangement are realized by controlling the flow rate of the gas flowing from the N1-th branch pipeline B3 to the stem pipeline B4 of the gas supply system B1.

What is claimed is:

1. A method for arranging a treatment process, in a case of treating an object to be treated by applying a process recipe used for a first treatment apparatus to a second treatment apparatus having a configuration different from that of the first treatment apparatus,
wherein the first treatment apparatus includes
a first treatment vessel in which the object to be treated is treated, and
a first gas supply system,
the first gas supply system includes a first main pipeline, a first stem pipeline, a plurality of first branch pipelines, a plurality of first flow rate controllers, and a plurality of first gas sources,
one end of the first main pipeline is connected to the first treatment vessel,
another end of the first main pipeline is connected to one end of the first stem pipeline,
one end of each of the plurality of first branch pipelines is connected to the first stem pipeline at a different position,
another end of each of the plurality of first branch pipelines is connected to each of the plurality of first gas sources,
each of the plurality of first flow rate controllers is installed with respect to each of the plurality of first branch pipelines and controls a flow rate of a gas flowing through each of the plurality of first branch pipelines,
first pipe numbers are allocated to the plurality of first branch pipelines,
the first pipe numbers are numbers from 1 to M and M is a natural number greater than 1 and represents a total number of the plurality of first branch pipelines,
first to M-th first branch pipelines are connected to the first stem pipeline from a portion close to the first main pipeline in an order of the first pipe numbers,
values of set flow rates of gases flowing from the first to M-th first branch pipelines to the first stem pipeline are different from each other,
each of the first to M-th first branch pipelines is connected to the first stem pipeline at a different position along the first stem pipeline in the order of the first pipe numbers, with the first first branch pipeline being connected to the first stem pipeline closest to the first main pipeline and the M-th first branch pipeline being connected to the first stem pipeline furthest from the first main pipeline,
the second treatment apparatus includes
a second treatment vessel in which the object to be treated is treated, and
a second gas supply system, the second gas supply system includes a second main pipeline, a second stem pipeline, a plurality of second branch pipelines, a plurality of second flow rate controllers, and a plurality of second gas sources, one end of the second main pipeline is connected to the second treatment vessel, another end of the second main pipeline is connected to one end of the second stem pipeline, one end of each of the plurality of second branch pipelines is connected to the second stem pipeline at a different position, another end of each of the plurality of second branch pipelines is connected to each of the plurality of second gas sources, each of the plurality of second flow rate controllers is installed with respect to each of the plurality of second branch pipelines and controls a flow rate of a gas flowing through each of the plurality of second branch pipelines, second pipe numbers are allocated to the plurality of second branch pipelines, the second pipe numbers are numbers from 1 to N and N is a natural number greater than 1 and represents a total number of the plurality of second branch pipelines, first to N-th second branch pipelines are connected to the second stem pipeline from a portion close to the second main pipeline in an order of the second pipe numbers, values of set flow rates of gases flowing from the first to N-th second branch pipelines to the second stem pipeline are different from each other, and each of the first to N-th second branch pipelines is connected to the second stem pipeline at a different position along the second stem pipeline in the order of the second pipe numbers, with the first second branch pipeline being connected to the second stem pipeline closest to the second main pipeline and the M-th second branch pipeline being connected to the second stem pipeline furthest from the second main pipeline, the method comprises:

a step of increasing or decreasing a flow rate of a gas of the second gas supply system, by a predetermined time from a start of a gas treatment step of the process recipe or by a predetermined time before a start of the gas treatment step, by using apparatus information regarding the first gas supply system and the second gas supply system, and arranging the treatment process, and in the step of arranging, the treatment process of the second treatment apparatus performed using the process recipe conforms to the treatment process of the first treatment apparatus performed using the process recipe.

2. The method according to claim 1,
wherein the step of arranging includes
a first step of selecting a M1-th (M1 is a natural number satisfying a relationship of $1 \leq M1 \leq M-1$) first branch pipeline and a M2-th (M2 is a natural number satisfying relationships of $2 \leq M2 \leq M$ and $M1<M2$) first branch pipeline corresponding to two kinds of gas types among the plurality of first branch pipelines, and a N1-th (N1 is a natural number satisfying a relationship of $1 \leq N1 \leq N-1$) second branch pipeline and a N2-th (N2 is a natural number satisfying relationships of $2 \leq N2 \leq N$ and $N1<N2$) second branch pipeline corresponding to two kinds of gas types among the plurality of second branch pipelines, in a case where two kinds of the gas types are used in the gas treatment step of the process recipe, and a second step of arranging the treatment process of the second treatment apparatus performed using the process recipe, based on a combination of the first pipe numbers M1 and M2 and values of the set flow rates corresponding to an M1-th first branch pipeline and an M2-th first branch pipeline selected among the plurality of first branch pipelines in the first step, and the second pipe numbers N1 and N2 and values of the set flow rates corresponding to an N1-th second branch pipeline and an N2-th second branch pipeline selected among the plurality of second branch pipelines in the first step.

3. The method according to claim 2,
wherein, in the second step, and in a case where a value of the set flow rate corresponding to the N2-th second branch pipeline is greater than a value of the set flow rate corresponding to the N1-th second branch pipeline and a value of the set flow rate corresponding to the M1-th first branch pipeline is greater than a value of the set flow rate corresponding to the M2-th first branch pipeline, the treatment process of the second treatment apparatus performed using the process recipe is arranged, so that a time from a start time of the gas treatment step of the process recipe until a flow rate of a gas from the N2-th second branch pipeline flowing to the second stem pipeline reaches the set flow rate, is set as a time necessary for a case where gas amount in the first stem pipeline is supplied at the set flow rate corresponding to the M2-th first branch pipeline, when pressure is stable.

4. The method according to claim 2,
wherein, in the second step, and in a case where a value of the set flow rate corresponding to the N1-th second branch pipeline is greater than a value of the set flow rate corresponding to the N2-th second branch pipeline and a value of the set flow rate corresponding to the M2-th first branch pipeline is greater than a value of the set flow rate corresponding to the M1-th first branch pipeline, the treatment process of the second treatment apparatus performed using the process recipe is arranged so that the flow rate of the gas flowing from the N2-th second branch pipeline becomes a value of a maximum flow rate of the gas flowing from the N2-th second branch pipeline to the second stem pipeline, during the time from a start time of the gas treatment step of the process recipe until a time necessary for a case where gas amount in the second stem pipeline is supplied at a difference flow rate obtained by subtracting a value of the set flow rate corresponding to the N2-th second branch pipeline from a value of a maximum flow rate of the gas flowing from the N2-th second branch pipeline to the second stem pipeline, when pressure is stable, has elapsed.

5. The method according to claim 2,
wherein, in the second step, and in a case where a value of the set flow rate corresponding to the N1-th second branch pipeline is greater than a value of the set flow rate corresponding to the N2-th second branch pipeline and a value of the set flow rate corresponding to the M2-th first branch pipeline is greater than a value of the set flow rate corresponding to the M1-th first branch pipeline, the treatment process of the second treatment apparatus performed using the process recipe is arranged so that the flow rate of the gas flowing from the N2-th second branch pipeline becomes a value of a maximum flow rate of the gas flowing from the N2-th second branch pipeline to the second stem pipeline, during the time from a non-start time of the gas treatment step of the process recipe until a time necessary for a case where gas amount in the second stem pipeline is supplied at a maximum flow rate of the gas flowing from the N2-th second branch pipeline to the second stem pipeline, when pressure is stable, has elapsed and the gas treatment step is started.

6. The method according to claim 2, wherein, in the second step, and in a case where a value of the set flow rate corresponding to the M1-th first branch pipeline is greater than a value of the set flow rate corresponding to the M2-th first branch pipeline, a value of the set flow rate corresponding to the N1-th second branch pipeline is greater than a value of the set flow rate corresponding to the N2-th second branch pipeline, and M2 is greater than N2, a difference gas amount obtained by subtracting gas amount in the second stem pipeline, when pressure is stable, from gas amount in the first stem pipeline, when pressure is stable, is calculated, and the treatment process of second treatment apparatus performed using the process recipe is arranged, so that the time from a start time of the gas treatment step of the process recipe until a flow rate of a gas from the N2-th second branch pipeline flowing to the second stem pipeline reaches the set flow rate, is set as a time necessary for a case where the difference gas amount is supplied at the set flow rate corresponding to the M2-th first branch pipeline.

7. The method according to claim 2, wherein, in the second step, and in a case where a value of the set flow rate corresponding to the M1-th first branch pipeline is greater than a value of the set flow rate corresponding to the M2-th first branch pipeline, a value of the set flow rate corresponding to the N1-th second branch pipeline is greater than a value of the set flow rate corresponding to the N2-th second branch pipeline, and N2 is greater than M2, a difference gas amount obtained by subtracting gas amount in the first stem pipeline, when pressure is stable, from gas amount in the second stem pipeline, when pressure is stable, is calculated, and the treatment process of the second treatment apparatus performed using the process recipe is arranged, so that the flow rate of the gas flowing from the N2-th second branch pipeline becomes a value of a maximum flow rate of the gas flowing from the N2-th second branch pipeline to the second stem pipeline, during the time from a start time of the gas treatment step of the process recipe until a time necessary for a case where the difference gas amount is supplied at a difference flow rate obtained by subtracting a value of the set flow rate corresponding to the N2-th second branch pipeline from a value of a maximum flow rate of the gas flowing from the N2-th second branch pipeline to the second stem pipeline has elapsed.

8. The method according to claim 2, wherein, in the second step, and in a case where a value of the set flow rate corresponding to the M1-th first branch pipeline is greater than a value of the set flow rate corresponding to the M2-th first branch pipeline, a value of the set flow rate corresponding to the N1-th second branch pipeline is greater than a value of the set flow rate corresponding to the N2-th second branch pipeline, and N2 is greater than M2, a difference gas amount obtained by subtracting gas amount in the first stem pipeline, when pressure is stable, from gas amount in the second stem pipeline, when pressure is stable, is calculated, and the treatment process of the second treatment apparatus performed using the process recipe is arranged, so that the flow rate of the gas flowing from the N2-th second branch pipeline becomes a value of a maximum flow rate of the gas flowing from the N2-th second branch pipeline to the second stem pipeline, during the time from a non-start time of the gas treatment step of the process recipe until a time necessary for a case where the difference gas amount is supplied at a maximum flow rate of the gas flowing from the N2-th second branch pipeline to the second stem pipeline has elapsed and the gas treatment step is started.

9. The method according to claim 1, wherein, in the step of arranging, a difference between volume of the first main pipeline and volume of the second main pipeline is determined, and the treatment process of the second treatment apparatus performed using the process recipe is arranged, based on this determined result.

10. The method according to claim 9, wherein, in the step of arranging, and in a case where volume of the first main pipeline is greater than volume of the second main pipeline, a difference main gas amount obtained by subtracting main gas amount in the second main pipeline, when pressure is stable, from main gas amount in the first main pipeline, when pressure is stable, is calculated, and the treatment process of the second treatment apparatus performed using the process recipe is arranged, so that the time from a start time of the gas treatment step of the process recipe until a main flow rate of a gas flowing through the second main pipeline reaches a preset main flow rate of the second main pipeline, is set as a time necessary for a case where the difference main gas amount is supplied at a preset main flow rate of the first main pipeline.

11. The method according to claim 9, wherein, in the step of arranging, and in a case where volume of the second main pipeline is greater than volume of the first main pipeline, a difference main gas amount obtained by subtracting main gas amount in the first main pipeline, when pressure is stable, from main gas amount in the second main pipeline, when pressure is stable, is calculated, and the treatment process of the second treatment apparatus performed using the process recipe is arranged, so that a main flow rate of the gas flowing through the second main pipeline becomes a value of a maximum main flow rate of the gas flowing to the second main pipeline, during the time from a start time of the gas treatment step of the process recipe until a time necessary for a case where the difference main gas amount is supplied at a difference main flow rate obtained by subtracting a value of a preset main flow rate of the second main pipeline from a value of a maximum main flow rate of the gas flowing to the second main pipeline has elapsed.

12. The method according to claim 9,
wherein, in the step of arranging, and in a case where volume of the second main pipeline is greater than volume of the first main pipeline,
a difference main gas amount obtained by subtracting main gas amount in the first main pipeline, when pressure is stable, from main gas amount in the second main pipeline, when pressure is stable, is calculated, and
the treatment process of the second treatment apparatus performed using the process recipe is arranged, so that a main flow rate of the gas flowing through the second main pipeline becomes a value of a maximum main flow rate of the gas flowing through the second main pipeline, during the time from a non-start time of the gas treatment step of the process recipe until a time necessary for a case where the difference main gas amount is supplied at a maximum main flow rate of the gas flowing through the second main pipeline has elapsed and the gas treatment step is started.

13. The method according to claim 1,
wherein, at a completion time of the gas treatment step,
a first attenuated main flow rate of a gas of the first main pipeline attenuated from a stop time of supply of the gas of the first gas supply system and a second attenuated main flow rate of a gas of the second main pipeline attenuated from a stop time of supply of the gas of the second gas supply system are compared to each other,
a difference attenuated main flow rate obtained by subtracting the second attenuated main flow rate from the first attenuated main flow rate is calculated, in a case where the first attenuated main flow rate is higher than the second attenuated main flow rate, and
the treatment process of the second treatment apparatus performed using the process recipe is arranged, so that a gas of the second gas supply system at the difference attenuated main flow rate flows to the second main pipeline, from a stop time of supply of the gas.

14. The method of claim 1, wherein M is a natural number greater than 2 and N is a natural number greater than 2.

15. A method for treating an object by a plurality of treatment apparatus including a first treatment apparatus and a second treatment apparatus,
wherein the first treatment apparatus includes a treatment vessel and a first gas supply system, and the second treatment apparatus includes a treatment vessel and a second gas supply system,
each of the first gas supply system and the second gas supply system includes:
a main pipeline connecting the treatment vessel to a stem pipeline,
a plurality of branch pipelines connecting the stem pipeline to a plurality of gas sources,
one end of each of the plurality of branch pipelines is connected to the stem pipeline at a different position, and
a plurality of flow rate controllers configured to control a flow rate of a gas flowing through each of the plurality of branch pipelines, wherein flow rate values from the branch pipelines to the stem pipeline are different from each other,
wherein a total number of the plurality of branch pipelines associated with the first treatment apparatus is a natural number M greater than 1, and
each of the branch pipelines is connected to the stem pipeline at a different position along the stem pipeline in an order of pipe numbers, with a first branch pipeline being connected to the stem pipeline closest to the main pipeline and a M-th branch pipeline being connected to the stem pipeline furthest from the main pipeline,
the method comprises:
adjusting a flow rate of the second gas supply system during a predetermined period of time by using apparatus information obtained from both the first gas supply system and the second gas supply system, and
treating the object with the second treatment apparatus using a treatment process recipe that conforms to a treatment process of the first treatment apparatus.

16. The method of claim 15, wherein the flow rate of the second gas supply system is adjusted during the predetermined period time from a start of a gas treatment step.

17. The method of claim 15, wherein the flow rate of the second gas supply system is adjusted during the predetermined period of time before a start of a gas treatment step.

18. The method of claim 15, wherein adjusting the flow rate comprises increasing the flow rate of the second gas supply system.

19. The method of claim 15, wherein adjusting the flow rate comprises decreasing the flow rate of the second gas supply system.

20. The method of claim 15, wherein M is a natural number greater than 2.

* * * * *